(12) United States Patent
Nagai

(10) Patent No.: US 8,395,197 B2
(45) Date of Patent: Mar. 12, 2013

(54) SEMICONDUCTOR DEVICE AND METHOD OF FORMING THE SAME

(75) Inventor: Takeshi Nagai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 282 days.

(21) Appl. No.: 12/961,252

(22) Filed: Dec. 6, 2010

(65) Prior Publication Data

US 2011/0140183 A1    Jun. 16, 2011

(30) Foreign Application Priority Data

Dec. 15, 2009  (JP) ................. P2009-283947

(51) Int. Cl.
  H01L 27/108  (2006.01)
  H01L 29/76   (2006.01)
  H01L 29/94   (2006.01)
  H01L 31/119  (2006.01)
  H01L 31/062  (2006.01)
  H01L 31/113  (2006.01)

(52) U.S. Cl. ............... 257/296; 257/345; 257/E27.016; 257/E29.255

(58) Field of Classification Search ............... 257/296, 257/345, E27.016, E29.255
See application file for complete search history.

(56) References Cited

U.S. PATENT DOCUMENTS

2007/0228495 A1 * 10/2007 Seto et al. ............ 257/402
2009/0020823 A1 *  1/2009 Fujita ................. 257/369
2009/0278209 A1 * 11/2009 Noda .................. 257/408

FOREIGN PATENT DOCUMENTS

JP      06-196492    7/1994
JP      2007-134732  5/2007

* cited by examiner

*Primary Examiner* — David S Blum
(74) *Attorney, Agent, or Firm* — McDermott Will & Emery LLP

(57) ABSTRACT

A semiconductor device includes a gate electrode on a gate insulating film over a semiconductor substrate, a first sidewall insulating film on a side surface of the gate electrode, and source and drain regions, each including a pocket diffusion layer of a first conductivity type, and first and second diffusion layers of a second conductivity type. The pocket diffusion layer is disposed in the semiconductor substrate. The first diffusion layer of a second conductivity type extends over the pocket diffusion layer. The first diffusion layer faces toward the gate electrode through the first sidewall insulating film. The second diffusion layer over the first diffusion layer is higher in impurity concentration than the first diffusion layer. The second diffusion layer is separated by the first diffusion layer from the pocket diffusion layer, and has a side surface which faces toward the first sidewall insulating film through the first diffusion layer.

20 Claims, 16 Drawing Sheets

SEMICONDUCTOR DEVICE AND METHOD OF FORMING THE SAME

BACKGROUND OF THE INVENTION

1. Field of the Invention

The present invention generally relates to a semiconductor device and a method of forming the same.

Priority is claimed on Japanese Patent Application No. 2009-283947, filed Dec. 15, 2009, the content of which is incorporated herein by reference.

2. Description of the Related Art

As shrinkage of semiconductor devices has been progressed, the dimension (or gate length) of a gate electrode of a metal-oxide-semiconductor (MOS)-type transistor has been reduced, and the influence of a short channel effect on electrical characteristics has become more serious.

For suppressing the short channel effect of the MOS transistor, a silicon layer is formed in source and drain regions using an epitaxial growth process, which is disclosed in Japanese Patent Application Laid-Open No. 2007-134732.

For suppressing the short channel effect of the MOS transistor, a pocket layer of an opposite conductivity type to impurities for forming source and drain regions is formed, which is disclosed in Japanese Patent Application Laid-Open No. 6-196492.

SUMMARY

In one embodiment, a semiconductor device may include, but is not limited to, a semiconductor substrate, a gate insulating film formed on a surface of the semiconductor substrate, a gate electrode formed on the gate insulating film, a first sidewall insulating film formed on a side surface of the gate electrode, and source and drain regions. Each of the source and drain regions may include, but is not limited to, a pocket diffusion layer of a first conductivity type, a first diffusion layer of a second conductivity type, and a second diffusion layer of the second conductivity type. The pocket diffusion layer of a first conductivity type is disposed in the semiconductor substrate. The first diffusion layer of a second conductivity type extends over the pocket diffusion layer. The first diffusion layer faces toward the gate electrode through the first sidewall insulating film. The second diffusion layer of the second conductivity type is higher in impurity concentration than the first diffusion layer. The second diffusion layer extends over the first diffusion layer. The second diffusion layer is separated by the first diffusion layer from the pocket diffusion layer. The second diffusion layer has a side surface which faces toward the first sidewall insulating film through the first diffusion layer.

In another embodiment, a semiconductor device may include, but is not limited to, a first circuit region comprising a first transistor, and a second circuit region comprising a second transistor. The second circuit region is isolated from the first circuit region. The first transistor may include, but is not limited to, a first active region, a first gate insulating film, a first gate electrode, a first sidewall insulating film, and first source and drain regions. The first gate insulating film is formed on a surface of the first active region. The first gate electrode is formed on the first gate insulating film. The first sidewall insulating film is formed on a side surface of the first gate electrode. Each of the first source and drain regions may include, but is not limited to, a pocket diffusion layer of a first conductivity type, a first diffusion layer of a second conductivity type, and a second diffusion layer of the second conductivity type. The pocket diffusion layer of a first conductivity type is disposed in the first active region. The first diffusion layer of a second conductivity type extends over the pocket diffusion layer. The first diffusion layer faces toward the gate electrode through the first sidewall insulating film. The second diffusion layer of the second conductivity type is higher in impurity concentration than the first diffusion layer. The second diffusion layer extends over the first diffusion layer. The second diffusion layer is separated by the first diffusion layer from the pocket diffusion layer. The second diffusion layer has a side surface which faces toward the first sidewall insulating film through the first diffusion layer. The second transistor may include, but is not limited to, a second active region, a second gate electrode, and second source and drain regions. The second gate electrode is formed in the second active region. The semiconductor layer is formed on a surface of the second active region. The second source and drain regions are formed in the semiconductor layer and in the second active region. The second source and drain regions are lower in impurity concentration than the first diffusion layer.

In still another embodiment, a semiconductor device may include, but is not limited to, a semiconductor substrate, a gate insulating film, a gate electrode, a first sidewall insulating film, a pocket diffusion layer of a first conductivity type, a first diffusion layer of a second conductivity type, and a second diffusion layer of the second conductivity type. The gate insulating film is formed on a surface of the semiconductor substrate. The gate electrode is formed on the gate insulating film. The first sidewall insulating film is formed on a side surface of the gate electrode. The pocket diffusion layer of a first conductivity type is formed in the semiconductor device. The first diffusion layer of a second conductivity type faces toward the gate electrode through the first sidewall insulating film. The second diffusion layer of the second conductivity type is higher in impurity concentration than the first diffusion layer. The second diffusion layer has a side surface which faces toward the first sidewall insulating film through the first diffusion layer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 21A, 21B, 21C and 21D, in order to facilitate the understanding of the present invention.

An example of a method of fabricating a transistor including a silicon layer and a pocket layer is illustrated in FIGS. 21A through 21D. The fabrication method includes stacking a gate insulating layer 94, a gate electrode 95, and an insulating layer 96 on a semiconductor substrate 91 and performing a patterning process using an ordinary method to form a gate electrode.

Figure 21A:
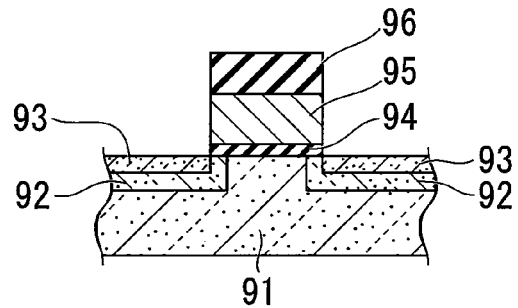
FIG. 21A is a fragmentary cross sectional elevation view illustrating a semiconductor device in a step involved in a method of forming a semiconductor device in related art.

As shown in FIG. 21A, a P-type impurity ion implantation process and an N-type impurity ion implantation process are sequentially performed, thereby forming a pocket impurity layer 92 and a lightly doped drain (LDD) impurity layer 93.

Figure 21B:
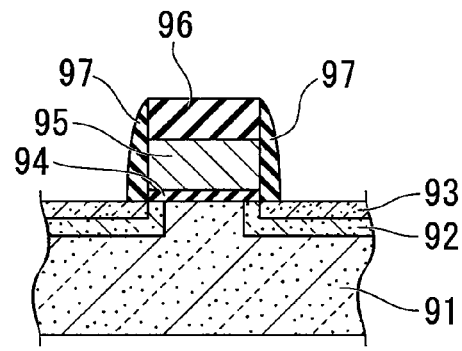
FIG. 21B is a fragmentary cross sectional elevation view illustrating a semiconductor device in a step subsequent to the step of FIG. 21A, involved in the method of forming a semiconductor device in related art.

As shown in FIG. 21B, sidewalls 97 are formed using an insulating layer on lateral surfaces of the gate electrode 95.

Figure 21C:
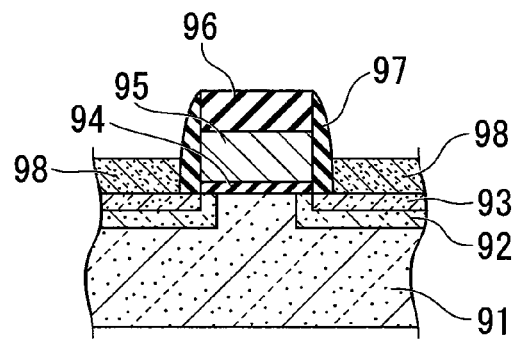
FIG. 21C is a fragmentary cross sectional elevation view illustrating a semiconductor device in a step subsequent to the step of FIG. 21B, involved in the method of forming a semiconductor device in related art.

As shown in FIG. 21C, an epitaxial growth process is performed on the LDD impurity layer 93 so that a silicon layer 98 where source and drain regions will be formed in a subsequent process can be gradually grown.

Figure 21D:
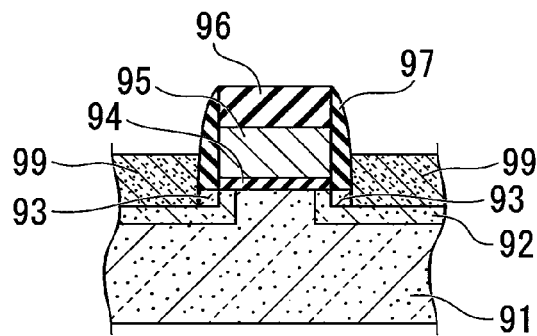
FIG. 21D is a fragmentary cross sectional elevation view illustrating a semiconductor device in a step subsequent to the step of FIG. 21C, involved in the method of forming a semiconductor device in related art.

As shown in FIG. 21D, by performing an ion implantation process on the silicon layer 98, a high-concentration impurity layer 99 is formed. The high-concentration impurity layer 99 is formed to reach the surface of the semiconductor substrate 91 so that the high-concentration impurity layer 99 can be electrically connected to the LDD impurity layer 93. In a MOS transistor, to improve a channel length Lmin on which prediction of occurrence of a short channel effect is based, it is necessary to set source and drain regions including the LDD impurity layer 93 and the high-concentration impurity layer 99 to a shallow depth. However, in the conventional MOS transistor shown in FIGS. 21A through 21D, when the LDD impurity layer 93 is formed to a shallow depth, forming the high-concentration impurity layer 99 to a shallow depth than the LDD impurity layer 93 becomes difficult. Thus, a lower portion of the high-concentration impurity layer 99 is in contact with the pocket impurity layer 92.

In the above-described transistor, from a viewpoint of electrical connection between the source/drain regions 99 and the LDD impurity layer 93, even if the grown amount of the silicon layer 98 is increased, lower portions of the source/drain regions 99 must be set to positions shown in FIG. 21D. For this reason, a channel length Lmin of the source/drain regions 99 is improved only within a limited range. Since there is no method for improving the channel length Lmin beyond the limited range, it is difficult to suppress a short channel effect with the advancement of miniaturization.

Furthermore, it is necessary to suppress a short channel effect of a MOS transistor more than in the conventional case to keep up with the advancement of miniaturization. However, in conventional methods, a short channel effect of a downscaled device is not sufficiently suppressed, and it is difficult to fabricate semiconductor devices including downscaled MOS transistors due to their high integration density.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate, a gate insulating film formed on a surface of the semiconductor substrate, a gate electrode formed on the gate insulating film, a first sidewall insulating film formed on a side surface of the gate electrode, and source and drain regions. Each of the source and drain regions may include, but is not limited to, a pocket diffusion layer of a first conductivity type, a first diffusion layer of a second conductivity type, and a second diffusion layer of the second conductivity type. The pocket diffusion layer of a first conductivity type is disposed in the semiconductor substrate. The first diffusion layer of a second conductivity type extends over the pocket diffusion layer. The first diffusion layer faces toward the gate electrode through the first sidewall insulating film. The second diffusion layer of the second conductivity type is higher in impurity concentration than the first diffusion layer. The second diffusion layer extends over the first diffusion layer. The second diffusion layer is separated by the first diffusion layer from the pocket diffusion layer. The second diffusion layer has a side surface which faces toward the first sidewall insulating film through the first diffusion layer.

In some cases, the second diffusion layer may have a bottom surface which is higher than the surface of the semiconductor substrate.

In some cases, the second diffusion layer may have a bottom surface which is higher than the gate insulating film.

In some cases, the first diffusion layer may contact the pocket diffusion layer.

In some cases, the semiconductor device may include, but is not limited to, a second sidewall insulating film extending along the first sidewall insulating film. The second sidewall insulates film being positioned on a top portion of the first diffusion layer.

In some cases, the semiconductor device may include, but is not limited to, an isolation layer in the semiconductor substrate. The isolation layer defines an active region in which the source and drain regions are positioned. The isolation layer has a bottom surface which is deeper than a bottom surface of the pocket diffusion layer.

In another embodiment, a semiconductor device may include, but is not limited to, a first circuit region comprising a first transistor, and a second circuit region comprising a second transistor. The second circuit region is isolated from the first circuit region. The first transistor may include, but is not limited to, a first active region, a first gate insulating film, a first gate electrode, a first sidewall insulating film, and first source and drain regions. The first gate insulating film is formed on a surface of the first active region. The first gate electrode is formed on the first gate insulating film. The first sidewall insulating film is formed on a side surface of the first gate electrode. Each of the first source and drain regions may include, but is not limited to, a pocket diffusion layer of a first conductivity type, a first diffusion layer of a second conductivity type, and a second diffusion layer of the second conductivity type. The pocket diffusion layer of a first conductivity type is disposed in the first active region. The first diffusion layer of a second conductivity type extends over the pocket diffusion layer. The first diffusion layer faces toward the gate electrode through the first sidewall insulating film. The second diffusion layer of the second conductivity type is higher in impurity concentration than the first diffusion layer.

The second diffusion layer extends over the first diffusion layer. The second diffusion layer is separated by the first diffusion layer from the pocket diffusion layer. The second diffusion layer has a side surface which faces toward the first sidewall insulating film through the first diffusion layer. The second transistor may include, but is not limited to, a second active region, a second gate electrode, and second source and drain regions. The second gate electrode is formed in the second active region. The semiconductor layer is formed on a surface of the second active region. The second source and drain regions are formed in the semiconductor layer and in the second active region. The second source and drain regions are lower in impurity concentration than the first diffusion layer.

In some cases, the second diffusion layer may have a bottom surface which is higher than the surface of the semiconductor substrate.

In some cases, the second diffusion layer may have a bottom surface which is higher than the gate insulating film.

In some cases, the first diffusion layer may contact the pocket diffusion layer.

In some cases, the semiconductor device may include, but is not limited to, a second sidewall insulating film extending along the first sidewall insulating film. The second sidewall insulating film is positioned on a top portion of the first diffusion layer.

In some cases, the first circuit region may include, but is not limited to, a peripheral circuit region. The second circuit region may include, but is not limited to, a memory cell region. The first transistor is a planer transistor. The second transistor is a trench transistor. The second gate electrode is partially buried in the semiconductor substrate.

In some cases, the semiconductor device may include, but is not limited to, a bit line connected to a first one of the second source and drain regions in the memory cell region; and a capacitor element connected to a second one of the second source and drain regions in the memory cell region.

In still another embodiment, a semiconductor device may include, but is not limited to, a semiconductor substrate, a gate insulating film, a gate electrode, a first sidewall insulating film, a pocket diffusion layer of a first conductivity type, a first diffusion layer of a second conductivity type, and a second diffusion layer of the second conductivity type. The gate insulating film is formed on a surface of the semiconductor substrate. The gate electrode is formed on the gate insulating film. The first sidewall insulating film is formed on a side surface of the gate electrode. The pocket diffusion layer of a first conductivity type is formed in the semiconductor device. The first diffusion layer of a second conductivity type faces toward the gate electrode through the first sidewall insulating film. The second diffusion layer of the second conductivity type is higher in impurity concentration than the first diffusion layer. The second diffusion layer has a side surface which faces toward the first sidewall insulating film through the first diffusion layer.

In some cases, the first diffusion layer may include, but is not limited to, first and second portions. The first portion extends over the pocket diffusion layer. The second portion extends along the first sidewall insulating film. The second diffusion layer extends over the first portion of the first diffusion layer. The second diffusion layer is separated by the first portion of the first diffusion layer from the pocket diffusion layer. The second diffusion layer is separated by the second portion of the first diffusion layer and the first sidewall insulating film from the gate electrode.

In some cases, the second diffusion layer may have a bottom surface which is higher than the surface of the semiconductor substrate.

In some cases, the first diffusion layer may contact the pocket diffusion layer.

In some cases, the semiconductor device may include, but is not limited to, a second sidewall insulating film extending along the first sidewall insulating film. The second sidewall insulating film is positioned on a top portion of the side surface of the second diffusion layer.

In some cases, the semiconductor device may include, but is not limited to, a bit line connected to the second diffusion layer.

In some cases, the semiconductor device may include, but is not limited to, a capacitor element connected to the second diffusion layer.

In an additional aspect, a method of forming a semiconductor device may include, but is not limited to, the following processes. A gate insulating film is formed on a surface of a semiconductor substrate. A gate electrode is formed on the gate insulating film. Pocket impurity diffusion layers of a second conductivity type are formed in the semiconductor substrate. The pocket impurity diffusion layers are positioned in both sides of the gate electrode. First insulating sidewalls are formed on side surfaces of the gate electrode. Silicon layers are formed over the pocket impurity diffusion layers. The silicon layers are positioned in both sides of the gate electrode. Lightly doped drain diffusion layers of a first conductivity type are formed in lower portions of the silicon layers. Second insulating sidewalls are formed on side surfaces of the first insulating sidewalls. Diffusion layers of the first conductivity type are formed by introducing an impurity into upper portions of the silicon layers by using the second insulating sidewalls as masks. The diffusion layers are higher in impurity concentration than the lightly doped drain diffusion layers.

In some cases, the diffusion layers face toward the side surfaces of the first insulating sidewalls through the lightly doped drain diffusion layers.

In some cases, the lightly doped drain diffusion layers are formed by carrying out an ion implantation process that introduces ions of the first conductivity type, wherein Rp (projected range) of the ions is set to reach about an intermediate position in thickness direction of the silicon layers.

In some cases, the diffusion layers are formed by carrying out another ion implantation process that introduces ions of the first conductivity type, wherein Rp (projected range) of the ions is set to reach in the range from about an intermediate position in thickness direction of the silicon layers to the upper surface of the silicon layers.

In an additional aspect, a method of forming a semiconductor device that includes a first circuit region and a second circuit region may include, but is not limited to, the following processes. A gate insulating film is formed on a surface of each of the first and second circuit regions of the semiconductor substrate. A gate electrode is formed on the gate insulating film in each of the first and second circuit regions of the semiconductor substrate. Pocket impurity diffusion layers of a second conductivity type are formed in the first circuit region, while the second circuit region is masked. The pocket impurity diffusion layers are positioned in both sides of the gate electrode in the first circuit region. First insulating sidewalls are simultaneously formed on side surfaces of the gate electrodes in the first and second circuit regions. Silicon layers are formed in the first and second circuit regions. The silicon layers are simultaneously positioned in both sides of the gate electrodes in the first and second circuit regions. Lightly doped drain diffusion layers of a first conductivity type are formed in lower portions of the silicon layers in the first circuit region, while the second circuit region is masked.

Second insulating sidewalls are simultaneously formed on side surfaces of the first insulating sidewalls in the first and second circuit regions. Diffusion layers of the first conductivity type are formed by introducing an impurity into upper portions of the silicon layers in the first circuit region by using the second insulating sidewalls as masks, while the second circuit region is masked. The diffusion layers are higher in impurity concentration than the lightly doped drain diffusion layers. A first inter-layer insulating film is formed, which covers both the first and second circuit regions. A contact hole is formed in the first inter-layer insulating film, wherein the contact hole is positioned over the silicon layer in the second circuit region. Lowly doped diffusion layers are formed in the silicon layer in the second circuit region by introducing an impurity of the first conductivity type. The lowly doped diffusion layers are lower in impurity concentration than the lightly doped drain diffusion layers.

In some cases, the diffusion layers face toward the side surfaces of the first insulating sidewalls through the lightly doped drain diffusion layers.

In some cases, the lightly doped drain diffusion layers are formed by carrying out an ion implantation process that introduces ions of the first conductivity type, wherein Rp (projected range) of the ions is set to reach about an intermediate position in thickness direction of the silicon layers.

In some cases, the diffusion layers are formed by carrying out another ion implantation process that introduces ions of the first conductivity type, wherein Rp (projected range) of the ions is set to reach in the range from about an intermediate position in thickness direction of the silicon layers to the upper surface of the silicon layers.

In some cases, lowly doped diffusion layers are formed by introducing the impurity into both the silicon layers in the second circuit region and the semiconductor substrate surfaces beneath the silicon layers in the second circuit region.

First Embodiment

Semiconductor Device

As an example of a semiconductor device according to a first embodiment of the present invention, a metal-oxide-semiconductor (MOS)-type transistor of an N-type channel, which is a first conductivity type, will be described with reference to FIG. 10.

Figure 10:
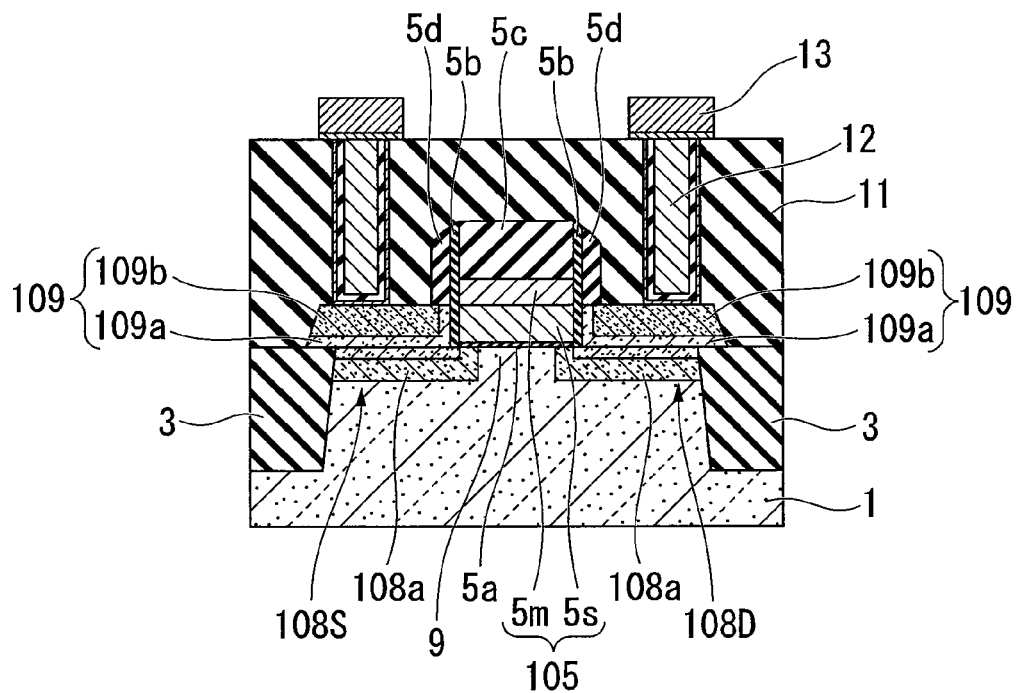
FIG. 10 is a fragmentary cross sectional elevation view illustrating a semiconductor device in a step, subsequent to the step of FIG. 9, involved in the method of forming the semiconductor device in the first embodiment of the present invention.

As shown in FIG. 10, the semiconductor device according to the first embodiment of the present invention includes a semiconductor substrate 1, a pocket impurity layer 108a formed in the vicinity of the surface of the semiconductor substrate 1, a gate electrode 105 formed on the semiconductor substrate 1 to overlap an end portion of the pocket impurity layer 108a, a gate insulating layer 5a formed between the semiconductor substrate 1 and the gate electrode 105, an insulating layer 5c formed on a top surface of the gate electrode 105, first insulating-layer sidewalls 5b formed on lateral surfaces of the gate electrode 105, a silicon layer 109 formed on the pocket impurity layer 108 to contact the first insulating-layer sidewalls 5b, second insulating-layer sidewalls 5d formed on lateral surfaces of the first insulating-layer sidewalls 5b to contact at least a portion of the silicon layer 109, a lightly doped drain (LDD) impurity layer 109 formed in a lower portion of the silicon layer 109, and a high-concentration source/drain impurity layer (or high-concentration impurity layer) 109b formed in an upper portion of the silicon layer 109.

Referring to FIG. 10, the semiconductor substrate 1 is formed of a semiconductor, for example, silicon, which contains impurities of a P-type, which is a second conductivity type, at a predetermined concentration. Isolation regions 3 with an insulating layer, such as a silicon oxide ($SiO_2$) layer, buried therein are formed in the semiconductor substrate 1. The isolation regions 3 are formed in portions other than active regions of the surface of the semiconductor substrate 1 and electrically insulate adjacent active regions from each other. The gate electrode 105, and a source (or source region) 108S and a drain (or drain region) 108D formed located on both sides of the gate electrode 105 are included in the active region, and a silicon layer 109 formed by selective epitaxial growth (SEG) is stacked on the source 108S and the drain 108D. The source 108S and the drain 108D are connected to a metal interconnection 13 by contact plugs 12 formed on the silicon layer 109. Also, the first insulating-layer sidewalls 5b and the second insulating-layer sidewalls 5d are formed on the lateral walls of the gate electrode 105. Furthermore, designations of the source and drain may be switched.

As shown in FIG. 10, in the semiconductor substrate 1, the source 108S and the drain 108D are formed apart from each other in the active region defined by the isolation regions 3, and the planar gate electrode 105 is formed between the source 108S and the drain 108D. The gate electrode 105 is formed of a multi-layer of a gate silicon layer 5s and a metal layer 5m to protrude upward from the semiconductor substrate 1. The gate silicon layer 5s is formed to contain impurities, such as phosphorus (P), during formation of a polysilicon (poly-Si) layer using a chemical vapor deposition (CVD) method. Also, in a subsequent process, N-type or P-type impurities may be introduced into a poly-Si layer formed not to contain impurities upon layer formation. The metal layer 5m may be formed of a metal having a high melting point, such as tungsten (W), tungsten nitride (WN), or tungsten silicide (WSi).

The gate insulating layer 5a is formed between the gate electrode 105 and the semiconductor substrate 1. For example, the gate insulating layer 5a may be formed of a single $SiO_2$ layer, a high dielectric (high-k) layer containing, for example, hafnium (Hf), or a stack layer of a silicon nitride ($Si_3N_4$) layer and a $SiO_2$ layer.

The first insulating-layer sidewalls 5b and the second insulating-layer sidewalls 5d are formed of an insulating layer, such as a $Si_3N_4$ layer, on the lateral walls of the gate electrode 105. An insulating layer 5c, such as a $Si_3N_4$ layer, is formed on the gate electrode 105 to protect a top surface of the gate electrode 105. Also, the first insulating-layer sidewalls 5b are formed on all lateral surfaces of the gate silicon layer 5s, the metal layer 5m, and the insulating layer 5c, and the second insulating-layer sidewalls 5d are formed in a lateral direction of the metal layer 5m and the insulating layer 5c.

The source 108S and the drain 108D include the P-type (or second conductivity type) pocket impurity layer 108a formed in the semiconductor substrate 1 on both sides of the gate electrode 105, the silicon layer 109 formed on the pocket impurity layer 108 using an SEG method, the N-type (or first conductivity type) LDD impurity layer 109a formed in the lower portion of the silicon layer 109, and the N-type (or first conductivity type) high-concentration source/drain impurity layer 109b formed in the upper portion of the silicon layer 109. The high-concentration source/drain impurity layer 109b is set to have a higher impurity concentration than the LDD impurity layer 109a. For example, boron (B) is introduced into the P-type pocket impurity layer 108a, P is introduced into the N-type LDD impurity layer 109a, and arsenic (As) is introduced into the N-type high-concentration source/drain impurity layer 109b.

As shown in FIG. 10, a lower portion of the high-concentration source/drain impurity layer 109b is formed to contact the LDD impurity layer 109a in the silicon layer 109. From a viewpoint of suppression of a short channel effect, it is preferable that the lower portion of the high-concentration source/drain layer 109b remain within the silicon layer 109, that is, that it be located over the top surface of the semiconductor substrate 1. Also, the LDD impurity layer 109a is formed not to spread outside a region of the pocket impurity layer 108a.

Also, as shown in FIG. 10, an interlayer insulating layer 11 is formed of an insulating layer, such as a $SiO_2$ layer, on the semiconductor substrate 1, and an upper metal interconnection 13 is formed of aluminum (Al) or copper (Cu) on the interlayer insulating layer 11. In addition, contact plugs 12 are formed through the interlayer insulating layer 11 to connect the source 108S and the drain 108D with the metal interconnection 13.

In the N-channel type MOS transistor having the above-described configuration, when a voltage is applied between the source 108S and the drain 108D and then a voltage is applied to the gate electrode 105, a channel region 9 through which electrons move is formed near an interface with the gate insulating layer 5a on the surface of the semiconductor substrate 1 between the source 108S and the drain 108D.

In the semiconductor device of the present invention, the pocket impurity layer 108a of the second conductivity type is formed in the vicinity of the surface of the semiconductor substrate 1 on both sides of the gate electrode 105. Also, the high-concentration source/drain impurity layer 109b of the first conductivity type is formed on the pocket impurity layer 108a via the LDD impurity layer 109a of the first conductivity type. Thus, since the high-concentration source/drain impurity layer 109b is formed apart from an end portion of the gate electrode 105, it is possible to effectively suppress occurrence of the short channel effect in spite of miniaturization.

Also, in the semiconductor device of the present invention, the lower portion of the high-concentration source/drain impurity layer 109b remains within the silicon layer 109, that is, is located over the top surface of the semiconductor substrate 1, thereby further suppressing the occurrence of the short channel effect.

Therefore, according to the semiconductor device of the present invention, it is possible to prevent power consumption from increasing due to a current increase in an off state of the transistor, and a circuit operation from failing due to a drop in threshold voltage. In other words, according to the present invention, a high-integrated high-performance semiconductor device may be obtained.

<Method of Fabricating Semiconductor Device>

A method of fabricating the semiconductor device according to the first embodiment of the present invention, for example, a method of fabricating a MOS-type transistor of an N channel type, which is a first conductivity type, will now be described with reference to FIGS. 1 through 10.

FIGS. 1 through 9 are cross-sectional views showing processes of the method of fabricating the semiconductor device according to the first embodiment of the present invention. FIG. 10 is a schematic cross-sectional view showing an example of the semiconductor device according to the first embodiment of the present invention.

To begin with, an insulating layer, such as a $SiO_2$ layer, is buried, for example, using a shallow trench isolation (STI) method in a semiconductor substrate 1 formed of silicon and of a P-type (or a second conductivity type), which is formed by introducing impurities using a thermal oxidation method, thereby forming isolation regions 3. Furthermore, in the present embodiment, a P-type well may be formed by ion implantation in a region of the semiconductor substrate 1 where a MOS transistor will be formed, in advance.

Figure 1:
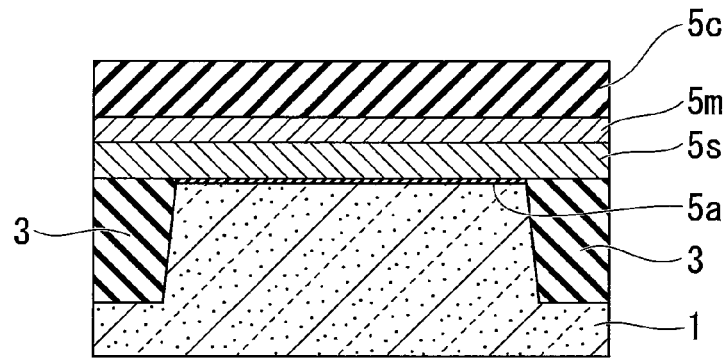
FIG. 1 is a fragmentary cross sectional elevation view illustrating a semiconductor device in a step involved in a method of forming the semiconductor device in a first embodiment of the present invention.

As shown in FIG. 1, a gate insulating layer 5a, a gate silicon layer 5s, a metal layer 5m such as a WSi layer, and an insulating layer 5c are sequentially formed.

The gate insulating layer 5a is formed to a thickness of, for example, about 5 nm by oxidizing the silicon surface of the semiconductor substrate 1 into $SiO_2$ using a thermal oxidation method. The gate insulating layer 5a may be formed of a stack layer of a $SiO_2$ layer and a $Si_3N_4$ layer or a high dielectric (or high-k) layer, such as a silicon oxynitride (SiON) layer or a hafnium oxide ($HfO_2$) layer.

The gate silicon layer 5s is formed by depositing a poly-Si layer containing P as N-type (or first conductivity type) impurities to a thickness of, for example, about 40 nm using a CVD method. Furthermore, the gate silicon layer 5s may be formed by forming a poly-Si layer free from impurities, such as P, and introducing impurities, such as P, into the poly-Si layer using an ion implantation method in a subsequent process.

The metal layer 5m is formed by depositing a metal (e.g., W, WN, or WSi) having a high melting point, to a thickness of about 50 nm using a CVD method.

The insulating layer 5c is formed by depositing a $Si_3N_4$ layer to a thickness of, for example, about 100 nm using a CVD method.

Figure 2:
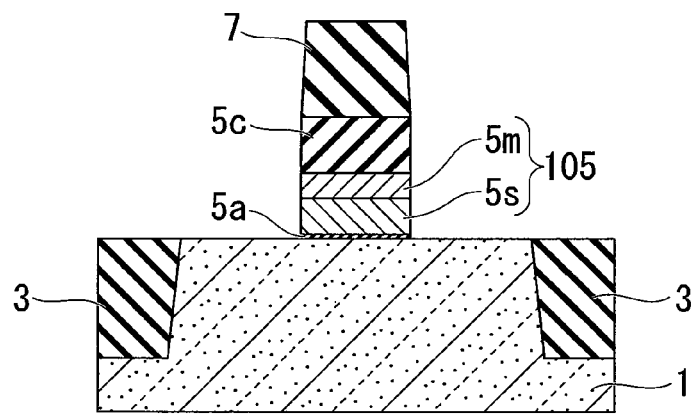
FIG. 2 is a fragmentary cross sectional elevation view illustrating a semiconductor device in a step, subsequent to the step of FIG. 1, involved in the method of forming the semiconductor device in the first embodiment of the present invention.

As shown in FIG. 2, a photoresist layer 7 is formed as a patterning mask using a photolithography technique. The insulating layer 5c, the metal layer 5m, and the gate silicon layer 5c are sequentially patterned by an anisotropic dry etching technique using the photoresist layer 7 as a mask, thereby forming a gate electrode 105. The gate electrode 105 is formed to intersect an active region, when viewed from the plan view. For example, the anisotropic dry etching is performed in an atmosphere of a pressure of about 10 to 50 mTorr using a gas mixture of, for example, chlorine ($Cl_2$), hydrogen bromide (HBr), and oxygen ($O_2$).

Figure 3:
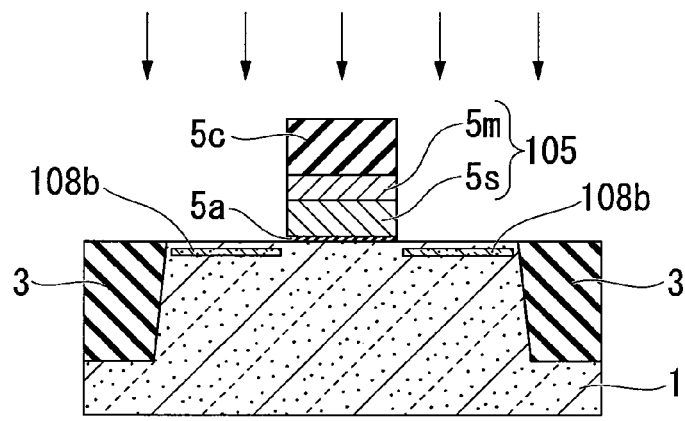
FIG. 3 is a fragmentary cross sectional elevation view illustrating a semiconductor device in a step, subsequent to the step of FIG. 2, involved in the method of forming the semiconductor device in the first embodiment of the present invention.
Figure 4:
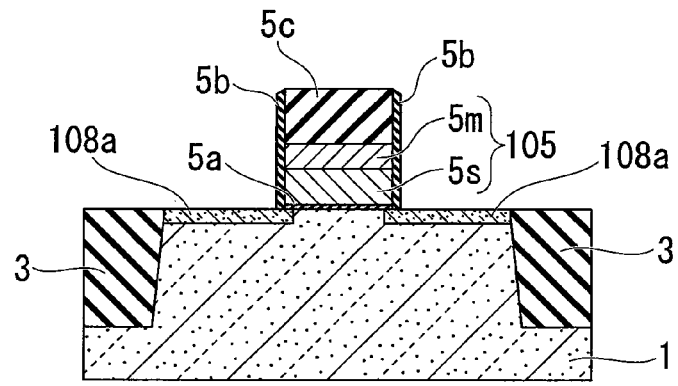
FIG. 4 is a fragmentary cross sectional elevation view illustrating a semiconductor device in a step, subsequent to the step of FIG. 3, involved in the method of forming the semiconductor device in the first embodiment of the present invention.

As shown in FIG. 3, after the photoresist layer 7 serving as the mask is removed, P-type (or second conductivity type) impurity ions are implanted into the semiconductor substrate 1 in self-alignment with the gate electrode 105, thereby forming pocket impurity portions 108b on both sides of the gate electrode 105. Specifically, for example, B ions are implanted as impurities at an energy of about 10 Kev with a dose of $1.5 \times 10^{13}$ atoms/$cm^2$.

A $Si_3N_4$ layer is deposited on the semiconductor substrate 1 to cover the gate electrode 105 using a low-pressure CVD (LPCVD) method, thereby forming a first insulating layer. For example, the formation of the $Si_3N_4$ layer is performed at a temperature of about 700° C. to a thickness of about 10 nm. Here, the pocket impurity portions 108b diffuse during the formation of the first insulating layer, thereby forming pocket impurity layers 108a. The pocket impurity layers 108a diffuse not only in a longitudinal direction (or vertical direction) but also in a traverse direction (or horizontal direction) and spread slightly inward from a lower end layer of the gate electrode 105a (or spread into a lower end layer of the gate insulating layer 5a). Then, the first insulating layer is etched back, thereby forming first insulating-layer sidewalls 5b on lateral walls of the gate electrode 105 to a thickness of about 10 nm.

Figure 5:
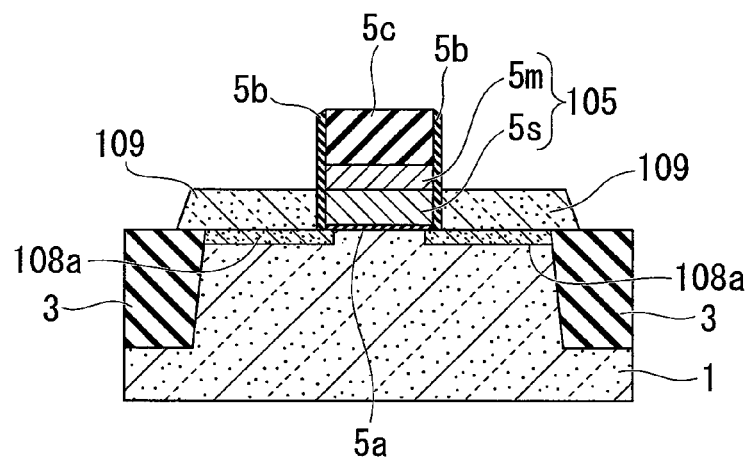
FIG. 5 is a fragmentary cross sectional elevation view illustrating a semiconductor device in a step, subsequent to the step of FIG. 4, involved in the method of forming the semiconductor device in the first embodiment of the present invention.

Subsequently, a cleaning process is performed using a cleaning solution having a low etch rate, such as diluted hydrogen fluoride (HF), to remove, for example, a native oxide layer from the surface of the semiconductor substrate and expose a clean surface (or silicon surface) of the semiconductor substrate 1. A silicon layer 109 is formed on the exposed surface of the semiconductor substrate 1 using a vapor-phase SEG method. For example, the silicon layer 109 is formed using dichlorosilane ($SiH_2Cl_2$) gas and hydrochloric-acid (HCl)-containing gas and grown to a thickness of about 40 nm. The silicon layer 109 is formed in the vertical direction to the substrate 1 along the first insulating-layer sidewalls 5b from the surface of the semiconductor substrate 1 using a vapor-phase SEG method. As shown in FIG. 5, the silicon layer 109 is selectively formed to be grown on a region in which the silicon surface of the semiconductor substrate 1 is exposed and slightly grown on the isolation regions 3, and a top surface of the silicon layer 109 has a generally flat shape without a facet.

Figure 6:
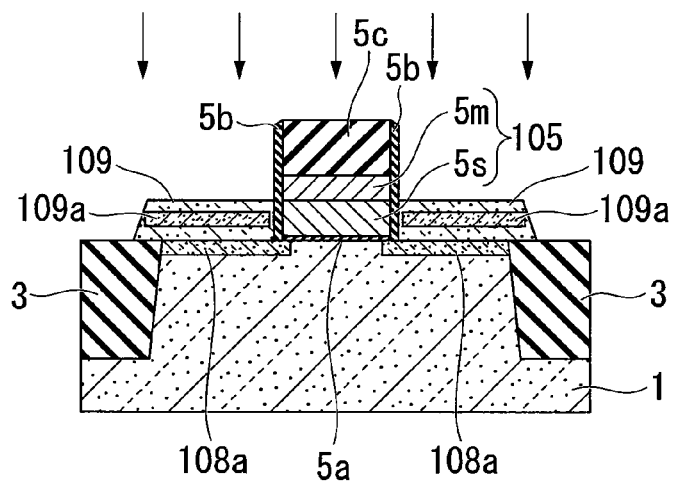
FIG. 6 is a fragmentary cross sectional elevation view illustrating a semiconductor device in a step, subsequent to the step of FIG. 5, involved in the method of forming the semiconductor device in the first embodiment of the present invention.

As shown in FIG. 6, N-type (or first conductivity type) impurity ions are implanted in self-alignment with the gate electrode 105 to form LDD impurity layers 109a. At this time, ion implantation energy is set such that a projected range (Rp) upon ion implantation lies midway along the thickness of the silicon layer 109. Specifically, for example, P ions are implanted as impurities at an energy of about 10 KeV with a dose of $2\times10^{13}$ atoms/$cm^2$.

Figure 7:
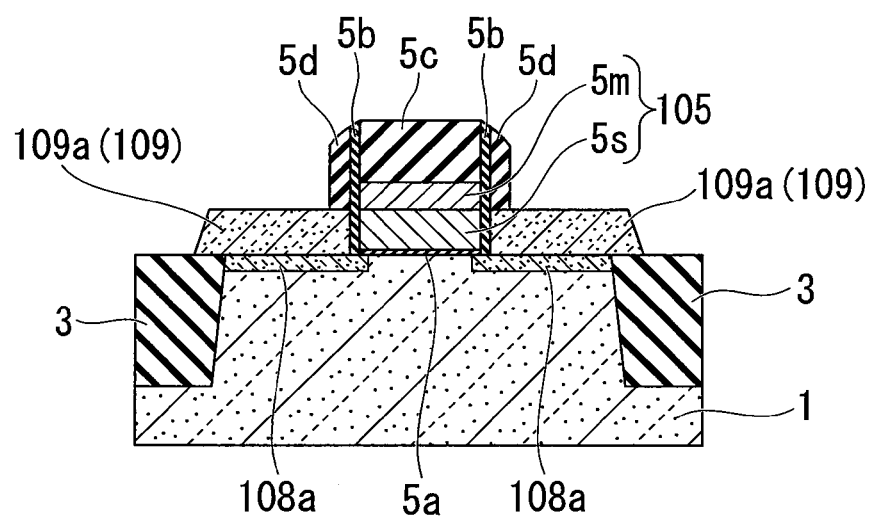
FIG. 7 is a fragmentary cross sectional elevation view illustrating a semiconductor device in a step, subsequent to the step of FIG. 6, involved in the method of forming the semiconductor device in the first embodiment of the present invention.

Subsequently, an insulating layer, such as a $Si_3N_4$ layer, is formed on the semiconductor substrate 1 to a thickness of, for example, about 30 nm using an LPCVD method to cover the gate electrode 105 and the silicon layer 109, thereby forming a second insulating layer. The second insulating layer is etched back to form second insulating-layer sidewalls 5d to a thickness of about 30 nm on the silicon layer 109 disposed on sides of the first insulating-layer sidewalls 5b formed on the lateral walls of the gate electrode 105, as shown in FIG. 7. Here, the formation of the insulating layer, such as a $Si_3N_4$ layer, is performed at a temperature of about 700° C., and the LDD impurity layers 109a diffuse into the silicon layer 109 during the formation of the second insulating layer. Also, although lower portions of the LDD impurity layers 109a may reach the inside of the semiconductor substrate 1, the ion implantation energy is set such that the LDD impurity layers 109a do not spread outside regions of the previously formed pocket impurity layers 108a.

Figure 8:
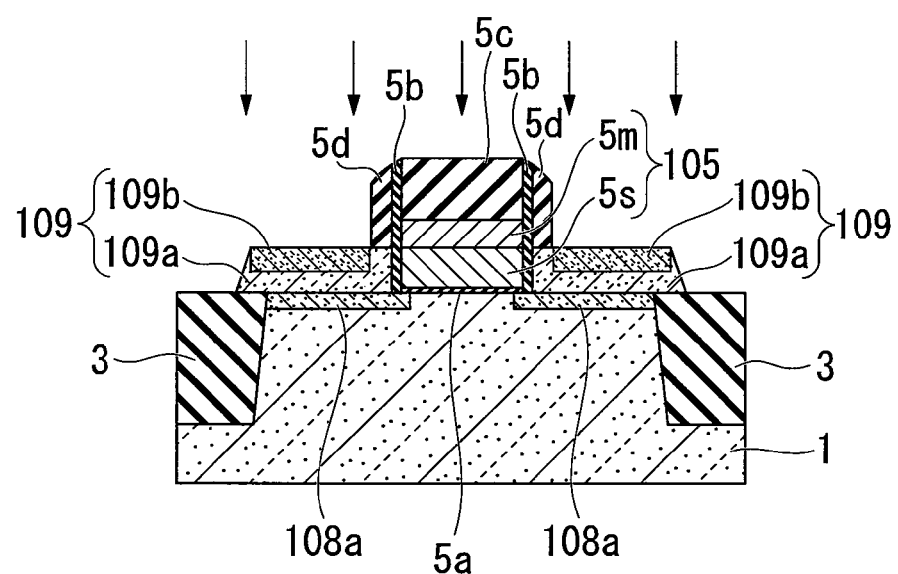
FIG. 8 is a fragmentary cross sectional elevation view illustrating a semiconductor device in a step, subsequent to the step of FIG. 7, involved in the method of forming the semiconductor device in the first embodiment of the present invention.

As shown in FIG. 8, N-type (or first conductivity type) impurity ions are implanted in self-alignment with the gate electrode 105 to form a high-concentration source/drain impurity layer 109b. Impurity concentration of the high-concentration source/drain impurity layer 109b is set to be higher than that of the previously formed LDD impurity layer 109a. Also, during the ion implantation, the ion implantation energy is set such that a projected range (Rp) upon ion implantation ranges from a midway point in the thickness of the silicon layer 109 to the top surface of the silicon layer 109. Specifically, for example, As ions are implanted as impurities at an energy of about 20 Kev with a dose of $5\times10^{15}$ atoms/$cm^2$.

Figure 9:
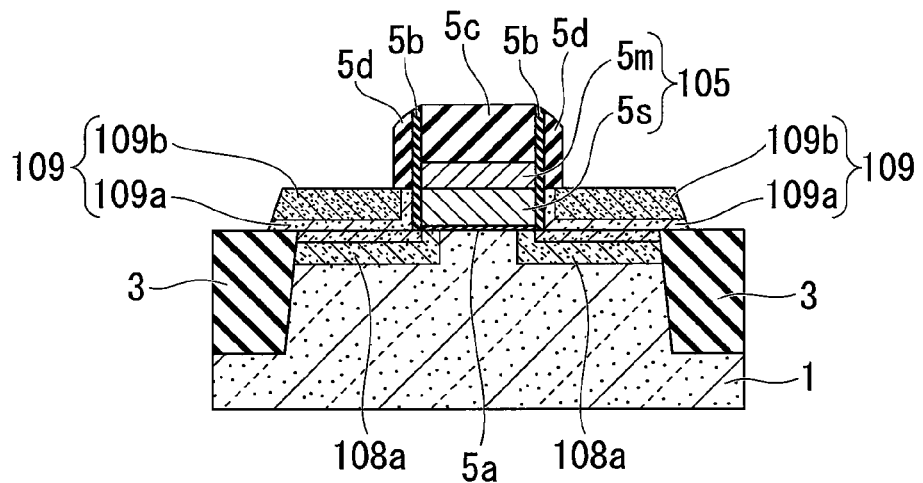
FIG. 9 is a fragmentary cross sectional elevation view illustrating a semiconductor device in a step, subsequent to the step of FIG. 8, involved in the method of forming the semiconductor device in the first embodiment of the present invention.

Subsequently, activation annealing of the implanted impurities is performed, for example, at a temperature of about 900° C. for 10 seconds in a nitride atmosphere using a rapid thermal annealing (RTA) method. Since the activation annealing is performed in a short period of time, diffusion of the high-concentration source/drain impurity layer 109b is suppressed to be slightly spread from a position in the implanted silicon layer 109. As shown in FIG. 9, lower portions of the high-concentration source/drain impurity layers 109b are formed to contact the LDD impurity layers 109a within the silicon layer 109. From a viewpoint of the suppression of the short channel effect, it is preferable that the thickness upon the formation of the silicon layer 109 and the ion implantation energy of the high-concentration source/drain impurity layer 109b be adjusted so that the lower portions of the high-concentration source/drain layers 109b can remain within the silicon layer 109, that is, are located over a top surface of the semiconductor substrate 1. Although the pocket impurity layer 108a and the LDD impurity layer 109a diffuse and spread to some extent due to the activation annealing, the LDD impurity layers 109a are set not to spread outside regions of the pocket impurity layers 108a by adjusting the implantation energy upon the formation of the LDD impurity layers 109a.

An interlayer insulating layer 11 is formed of $SiO_2$ using a CVD method to cover the gate electrode 105 and the silicon layer 109. Subsequently, contact holes connected to the silicon layer 109 as source and drain regions are opened. A titanium (Ti) layer, a titanium nitride (TiN) layer, and a W layer are sequentially formed in the contact holes and polished using a chemical mechanical polishing (CMP) method to form contact plugs 12. A contact plug connected to the gate electrode 105 is formed in the same manner in another region not shown. Afterwards, a TiN layer and an Al layer are sequentially formed and patterned to form metal interconnections 13 connected to the contact plugs 12.

In the above-described process, the MOS transistor, which is the semiconductor device according to the first embodiment of the present invention, is completed.

In the method of fabricating the semiconductor device of the present invention, after the pocket impurity layer 108a of the second conductivity type opposite to the first conductivity type of the LDD impurity layer 109a is previously formed in the vicinity of the surface of the semiconductor substrate 1, the LDD impurity layer 109a is introduced into the silicon layer 109 formed on the pocket impurity layer 108a. Thereafter, the high-concentration source/drain impurity layer 109b of the first conductivity type is introduced into regions of the silicon layer 109 that are not covered with the second insulating-layer sidewalls 5d formed on the lateral surfaces of the gate electrode 105. Thus, the LDD impurity layers 109a and the high-concentration source/drain impurity layers 109b are prevented from diffusing in the traverse direction (or horizontal direction), thereby suppressing occurrence of a short channel effect. In other words, in the present invention, the LDD impurity layers 109a are introduced into the silicon layer 109 formed on the surface of the semiconductor substrate 1 using ion implantation instead of being directly introduced into the surface of the semiconductor substrate 1 using ion implantation. Thus, the LDD impurity layer 109 passes beyond the initially formed pocket impurity layer 108a and diffuses into a lower region of the gate electrode 105 (or a region disposed inward from the end of the gate electrode 105, that is, a lower end portion of the gate insulating layer 5a), so that occurrence of a short channel effect may be prevented. Also, after the second insulating-layer sidewalls 5d are formed, the high-concentration source/drain impurity layers 109b are formed using the ion implantation process. Thus, the high-concentration source/drain impurity layers 109b may be formed apart from the ends of the gate electrode 105 so that the occurrence of the short channel effect can be prevented more effectively.

Also, in the method of fabricating the semiconductor device of the present invention, the high-concentration source/drain impurity layers 109b can be formed so that the lower portions of the high-concentration source/drain impurity layers 109b remain within the silicon layer 109, that is, are located over the top surface of the semiconductor substrate 1, thereby further suppressing the occurrence of the short channel effect.

Accordingly, it is possible to prevent power consumption from increasing due to a current increase in an off state of the transistor, and a circuit operation from failing due to a drop in a threshold voltage. In other words, according to the present invention, a high-performance semiconductor device can be easily fabricated with high integration.

Although the N-channel transistor has been described in the present embodiment, the present invention may be applied to a P-channel transistor. In this case, an N-type well is previously formed in a region of a semiconductor substrate 1 where the P-channel transistor will be formed. Thus, N-type impurities, such as P, may be implanted as a pocket impurity layer 108a, P-type impurities, such as B, may be implanted as an LDD impurity layer 109a, and P-type impurities, such as boron fluoride ($BF_2$), may be implanted as high-concentration source/drain impurity layers 109b.

Since the ion implantation conditions described in the present embodiment are only an example, changes in implantation energy, dose, and kind of ions may be made without departing from the spirit and scope of the present invention. Also, materials and thicknesses of the insulating layer and the gate electrode may be changed.

In addition, a combination of methods for high performance used in, for example, a conventional planar MOS may be used without departing from the spirit and scope of the present invention.

Second Embodiment

In the present invention, the MOS transistor shown as the semiconductor device of the first embodiment may be applied to only a portion of the semiconductor device. A second embodiment of the present invention in which when a DRAM device is formed as a semiconductor device, a transistor provided in a memory cell region is a groove-type transistor (or trench-gate transistor) to which the present invention is not applied and the present invention is applied to a transistor provided in a peripheral circuit region will now be described. Furthermore, in the following description, the same reference numerals are used to denote the same components in the memory cell region of the second embodiment as in the first embodiment described above, and a description of the same components will be omitted.

<Semiconductor Device>

An example of a semiconductor device according to the second embodiment will now be described with reference to FIGS. 11 through 13.

A dynamic random access memory (DRAM), which is the semiconductor device of the present embodiment, is largely comprised of a peripheral circuit region (or first circuit region) and a memory cell region (or second circuit region). The peripheral circuit region is disposed adjacent to the memory cell region. The peripheral circuit region includes, for example, a sense amplifier circuit, a word line driver circuit, and an input/output (I/O) circuit connected to the outside.

Figure 11:
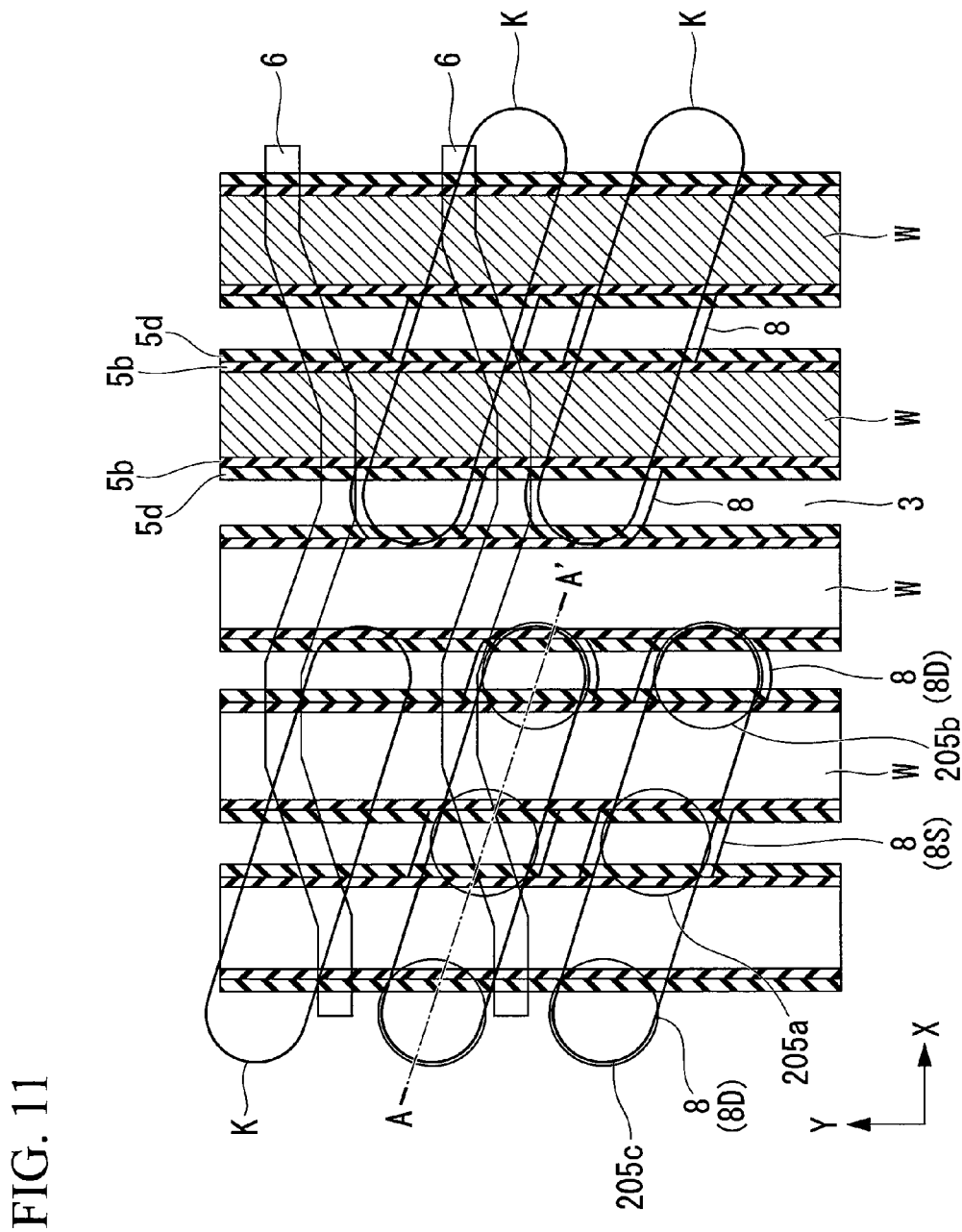
FIG. 11 is a fragmentary plan view illustrating a memory cell region of a semiconductor device in accordance with a second embodiment of the present invention.

FIG. 11 is a conceptual diagram showing a planar structure of the memory cell region of the DRAM, which is the semiconductor device of the present embodiment, in which only some elements of a memory cell are shown. A right portion of FIG. 11 is a transmitted cross-sectional view obtained on the basis of a surface that cuts a gate electrode (or second gate electrode) 5, which will be a word line W, first insulating-layer sidewalls 5b, and second insulating-layer sidewalls 5d. A capacitor element is omitted in FIG. 11 and illustrated only in the cross-sectional views of FIGS. 13A and 13B.

Figure 12:
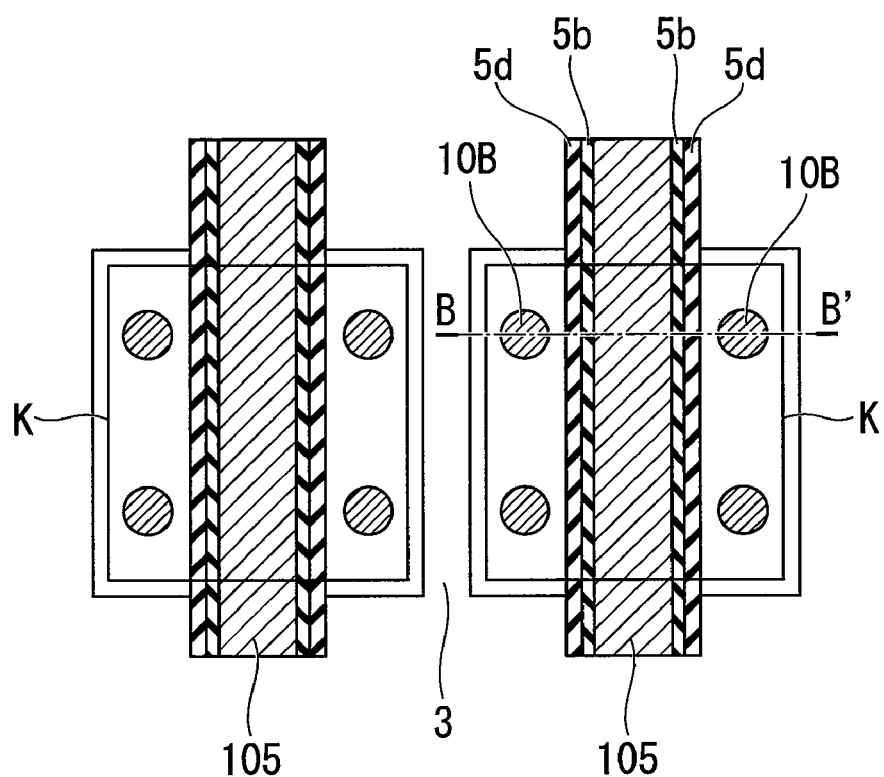
FIG. 12 is a fragmentary plan view illustrating a peripheral circuit region of the semiconductor device in accordance with the second embodiment of the present invention.

FIG. 12 is a conceptual diagram showing a plane structure of a principal portion of the peripheral circuit region of the DRAM.

Figure 13A:
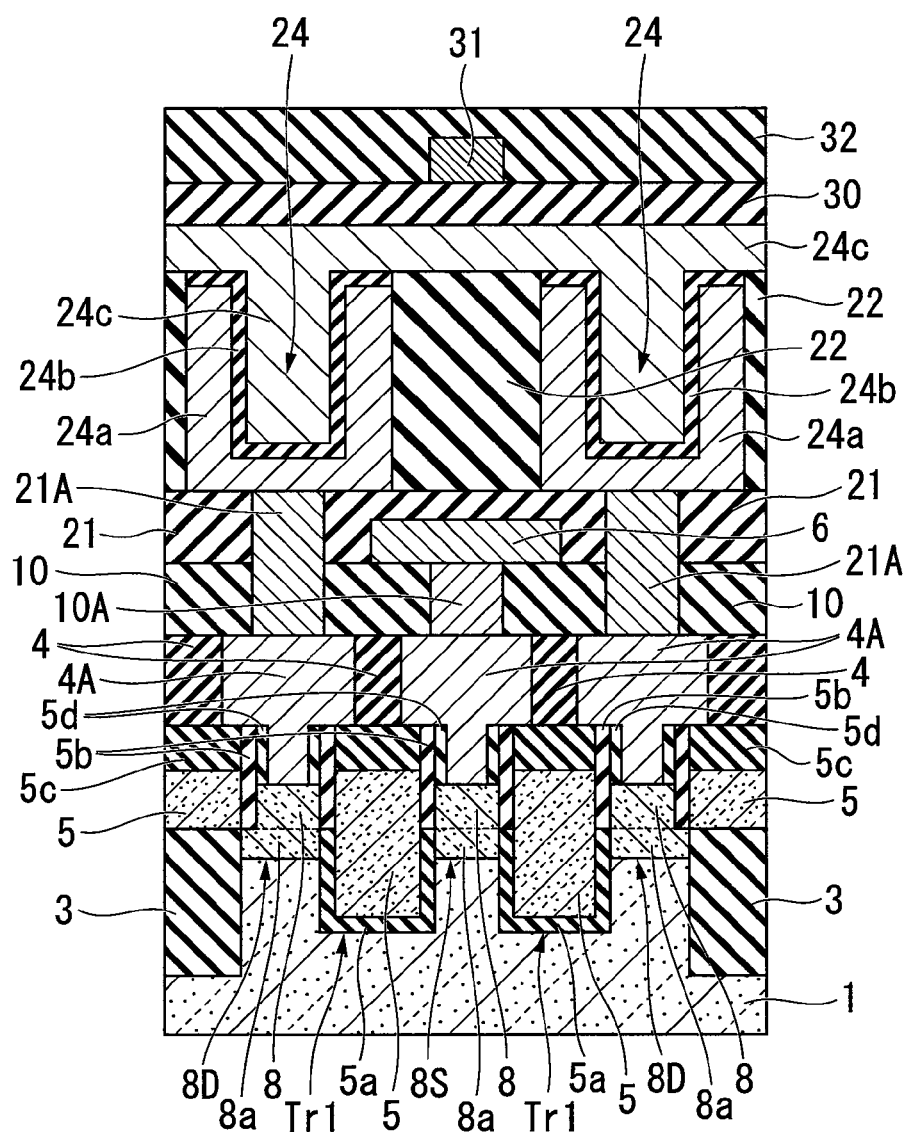
FIG. 13A is a fragmentary cross sectional elevation view illustrating the memory cell region, taken along an A-A' line of FIG. 11.
Figure 13B:
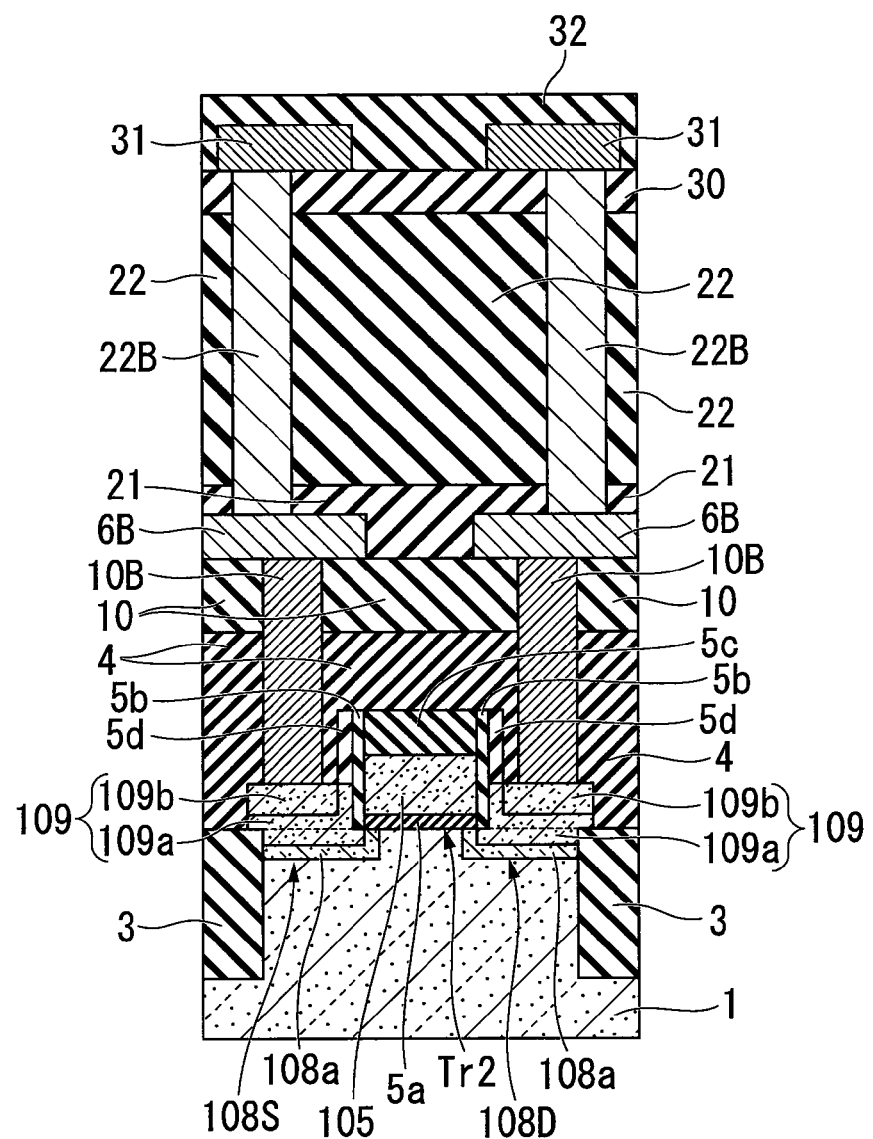
FIG. 13B is a fragmentary cross sectional elevation view illustrating the peripheral circuit region, taken along a B-B' line of FIG. 12.

FIG. 13A is a schematic cross-sectional view corresponding to line A-A' of FIG. 11 (or memory cell region), and FIG. 13B is a schematic cross-sectional view corresponding to line B-B' of FIG. 12 (or peripheral circuit region). Also, since FIGS. 12, 13A, and 13B are provided to describe the configuration of the semiconductor device, the sizes and dimensions of the respective portions shown in FIGS. 12, 13A, and 13B are different from those of actual semiconductor devices.

First, the memory cell region will be described with reference to FIGS. 11 and 13A. As shown in FIG. 13A, the memory cell region is generally comprised of a MOS transistor Tr1 for a memory cell and a capacitor element (or capacitance unit) 24 connected to the MOS transistor Tr1 via a substrate contact plug 4A and a capacitor contact plug 21A.

Referring to FIGS. 11 and 13A, the semiconductor substrate 1 is formed of a semiconductor containing P-type impurities at a predetermined concentration, for example, silicon. Isolation regions 3 are formed in the semiconductor substrate 1. The isolation regions 3 are formed by burying an insulating layer, such as a $SiO_2$ layer, in the surface of the semiconductor substrate 1 using an STI method. The isolation regions 3 are formed in portions other than active regions (second active regions) K and electrically insulate adjacent active regions K from each other. The present embodiment shows an example of a case where the present invention is applied to a cell structure in which a 2-bit memory cell is disposed in a single active region K.

In the present embodiment, as shown in the planar structure of FIG. 11, a plurality of active regions K in an elongated strip shape are spaced a predetermined distance apart from one another and aligned to be inclined rightward and downward. An impurity diffusion layer is disposed in each of both end portions and a central portion of each of the active regions K. Thus, a source (or source region) 8S is formed in the central portion of each of the active regions K, drains (or drain regions) 8D are respectively formed in the both end portions of each of the active regions K. Also, substrate contacts 205a, 205b, and 205c are defined as being disposed directly on the source 8S and the drains 8D.

Furthermore, although the arrangement of the active regions K in a planar shape as shown in FIG. 11 is unique to the present embodiment, the shape and alignment direction of the active regions K may not be specially limited. The shape of the active regions K shown in FIG. 11 may naturally be the shape of active regions applied to other typical transistors and is not limited to the shape of the present invention. Also, the designations of the source and drain may be switched.

A plurality of bit lines 6 are elongated in a bent-line shape in a traverse (or X) direction of FIG. 11 and spaced a predetermined distance apart from one another in a longitudinal (or Y) direction of FIG. 11. Also, a plurality of word lines W are disposed in a straight-line shape and extend in the longitudinal (or Y) direction of FIG. 11. The plurality of word lines W are spaced a predetermined distance apart from one another in the traverse (or X) direction of FIG. 1, and the gate electrode 5 shown in FIG. 13A is included in a portion in which the word line W intersects the active region K. Although a case where the MOS transistor Tr1 includes a groove-type gate electrode 5 is illustrated as an example in the present embodiment, a transistor having another configuration may be used. The MOS transistor having the groove-type gate electrode may be replaced with a planar-type MOS transistor or a MOS transistor in which a channel region is formed on a lateral surface of a groove formed in a semiconductor substrate.

As shown in a cross-sectional structure of FIG. 13A, the source 8S and the drain 8D are formed apart from each other in the active region K defined by the isolation regions 3 in the semiconductor substrate 1, and the groove-type gate electrode 5 is formed between the source 8S and the drain 8D. The gate electrode 5 is formed of a multi-layer of a poly-Si layer and a metal layer to protrude upward from the semiconductor substrate 1. The poly-Si layer may be formed to contain impurities, such as P, when formed using a CVD method. Alternatively, the poly-Si layer may be formed not to contain impurities, and N-type or P-type impurities may be implanted into the poly-Si layer using an ion implantation process in a subsequent process. The metal layer may be formed of a metal having a high melting point, such as W, WN, or WSi.

Also, as shown in FIG. 13A, a gate insulating layer $5a$ is formed between the gate electrode 5 and the semiconductor substrate 1. The gate insulating layer $5a$ may be the same as that in the first embodiment.

First insulating-layer sidewalls $5b$ and second insulating-layer sidewalls $5d$ may be formed of an insulating layer, such as a $Si_3N_4$ layer, on lateral walls of the gate electrode 5, and an insulating layer $5c$ such as a $Si_3N_4$ layer is formed on the gate electrode 5 to protect a top surface of the gate electrode 5.

The source 8S and the drain 8D are comprised of a silicon layer (or second silicon layer) 8 formed to contact the active region K formed in the semiconductor substrate 1 and a cell impurity layer $8a$ formed in the silicon layer 8 using an ion implantation process. The cell impurity layer $8a$ is formed within the silicon layer 8 and also diffuses into the surface of the semiconductor substrate 1 so that a low-concentration impurity layer can be integrally formed within both the silicon layer 8 and the surface of the semiconductor substrate 1. The silicon layer 8 is formed using an SEG method. For example, P ions are introduced as N-type impurities into the cell impurity layer $8a$.

Also, as shown in FIG. 13A, a first interlayer insulating layer 4 is formed of an insulating layer, such as a $SiO_2$ layer, on the semiconductor substrate 1, and substrate contact plugs 4A are formed through the first interlayer insulating layer 4. The substrate contact plugs 4A are respectively disposed in positions of the substrate contacts $205c$, $205a$, and $205b$ and formed to be connected to the silicon layer 8 formed as the source 8S and the drain 8D. The substrate contact plugs 4A are formed of a poly-Si layer containing, for example, P.

In addition, a second interlayer insulating layer 10 formed using an insulating layer, such as a $SiO_2$ layer, is stacked on the first interlayer insulating layer. A bit line contact plug 10A is formed in the second interlayer insulating layer 10 and connected to the substrate contact plug 4A. The bit line contact plug 10A is formed by stacking a W layer on a barrier layer (TiN/Ti) formed of a stack layer of TiN and Ti. A bit line 6 is formed to be connected to the bit line contact plug 10A. The bit line 6 is formed of a stack layer of WN and W.

A third interlayer insulating layer 21 is formed of an insulating layer, such as a $SiO_2$ layer, to cover the bit line 6. Capacitor contact plugs 21A are formed through the second interlayer insulating layer 10 and the third interlayer insulating layer 21 and connected the substrate contact plugs 4A. A fourth interlayer insulating layer 22 is formed of an insulating layer, such as a $SiO_2$ layer, on the third interlayer insulating layer 21, and capacitor elements 24 are formed to be connected to the capacitor contact plugs 21A.

The capacitor element 24 includes a lower electrode $24a$, an upper electrode $24c$, and a high-dielectric (or high-k) capacitor insulating layer $24b$ formed of a high-k material between the lower and upper electrodes $24a$ and $24c$. The high-k material may be, for example, zirconium oxide ($ZrO_2$), aluminum oxide ($Al_2O_3$), $HfO_2$, or a stack structure thereof. The lower electrode $24a$ and the upper electrode $24c$ may be formed of a metal layer, such as a TiN layer. The lower electrode $24a$ and the capacitor contact plug 21A are electrically connected.

A fifth interlayer insulating layer 30 is formed of, for example, $SiO_2$ on the capacitor element 24 to cover the upper electrode $24c$. In addition, an upper metal interconnection layer 31 formed of Al or Cu and a surface protection layer 32 formed of SiON are formed on the fifth interlayer insulating layer 30.

The memory cell region having the above-described configuration operates as a memory cell of a DRAM capable of performing a data storage operation, in which a determination can be made as to whether or not there are charges accumulated in the capacitor element 24, via the bit line 6, by turning the MOS transistor Tr1 on.

Next, the peripheral circuit region will be described with reference to FIGS. 12 and 13B. The peripheral circuit region includes a planar-gate-type MOS transistor Tr2 to which the present invention is applied, as shown in FIG. 13B. Hereinafter, a case where the transistor Tr2 has an N-type (or first conductivity type) channel will be described.

FIG. 12 is a conceptual diagram of a planar structure of the peripheral circuit region of the DRAM device, which is the semiconductor device of the present embodiment, in which only some elements constituting a peripheral circuit are shown.

As shown in FIGS. 12 and 13B, in the present embodiment, the peripheral circuit includes a gate electrode (or first gate electrode) 105, a source 108S, and a drain 108D, which are disposed in an active region (or first active region) K, and a silicon layer (or first silicon layer) 109 formed using selective epitaxial growth is stacked on the source 108S and the drain 108D. The source 108S and the drain 108D are connected to another element by contact plugs 10B formed on the silicon layer 109. Also, first insulating-layer sidewalls $5b$ and second insulating-layer sidewalls $5d$ are formed on lateral walls of the gate electrode 105.

Furthermore, although the arrangement of the active regions K in a planar shape as shown in FIG. 12 is unique to the present embodiment, the shape and alignment direction of the active regions K may not be specially limited. The shape of the active regions K shown in FIG. 12 may naturally be the shape of active regions applied to other typical transistors and is not limited to the shape of the present invention. Also, the designations of the source and drain may be switched.

As shown in a cross-sectional structure of FIG. 13B, the source 108S and the drain 108D are formed apart from each other in the active region K defined by isolation regions 3 in a semiconductor substrate 1, and a planar gate electrode 105 is formed between the source 108S and the drain 108D. Like the above-described gate electrode 5 of the memory cell, the gate electrode 105 is formed of a stacked layer of a poly-Si layer and a metal layer.

A gate insulating layer $5a$ is formed between the gate electrode 105 and the semiconductor substrate 1, and the first insulating-layer sidewalls $5b$ and the second insulating-layer sidewalls $5d$ are formed of an insulating layer, such as a $Si_3N_4$ layer, on lateral walls of the gate electrode 105. An insulating layer $5c$, such as a $Si_3N_4$ layer, is formed on the gate electrode 105.

The source 108S and the drain 108D are comprised of a P-type (or second conductivity type) pocket impurity layer $108a$ formed in the semiconductor substrate 1, a silicon layer 109 formed on the pocket impurity layer $108a$, an N-type (or first conductivity type) LDD impurity layer $109a$ formed in a lower portion of the silicon layer 109, and an N-type (or first conductivity type) high-concentration source/drain impurity layer 109b formed in an upper portion of the silicon layer 109. The impurity concentration of the high-concentration source/drain impurity layer 109b is set to be higher than that of the LDD impurity layer 109a. Also, the silicon layer 109 is formed at the same time as the silicon layer 8 of the memory cell region using a selective epitaxial growth method.

Also, as shown in FIG. 13B, a first interlayer insulating layer 4 and a second interlayer insulating layer 10 are formed on the semiconductor substrate 1, and contact plugs 10B are formed through the first interlayer insulating layer 4 and the second interlayer insulating layer 10. The contact plugs 10B are formed by stacking a W layer on a barrier layer formed of TiN/Ti. The contact plugs 10B and the bit line contact plugs 10A of the memory cell region may be formed at the same time. An interconnection layer 6B is formed on the contact plugs 10B using the same interconnection layer as the bit lines 6 of the memory cell region and connected to the contact plugs 10B.

A third interlayer insulating layer 21 is formed to cover the interconnection layer 6B. A fourth interlayer insulating layer 22 and a fifth interlayer insulating layer 30 are formed on the third interlayer insulating layer 21, and a metal interconnection layer 31 is formed on the fifth interlayer insulating layer 30. Peripheral contact plugs 22B are formed through the third interlayer insulating layer 21, the fourth interlayer insulating layer 22, and the fifth interlayer insulating layer 30 to connect between the interconnection layer 6B and the metal interconnection layer 31.

<Method of Fabricating Semiconductor Device>

A method of fabricating the semiconductor device of the present embodiment will be described with reference to FIGS. 14A through 20B. FIGS. 14A through 20A are schematic cross-sectional views corresponding to line A-A' of the memory cell region (of FIG. 11), and FIGS. 14B through 20B are schematic cross-sectional views corresponding to line B-B' of the peripheral circuit region (of FIG. 12). Furthermore, unless expressly defined herein, a process of fabricating the MOS transistor Tr1 of the memory cell and a process of fabricating the MOS transistor Tr2 of the peripheral circuit will now be simultaneously described.

Figure 14A:
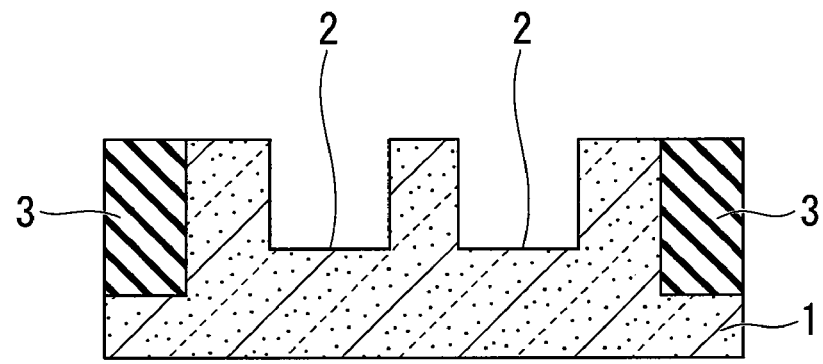
FIG. 14A is a fragmentary plan view illustrating the memory cell region, taken along an A-A' line of FIG. 11, in a step involved in a method of forming the semiconductor device of FIGS. 11, 12, 13A and 13B, in accordance with the second embodiment of the present invention.
Figure 14B:
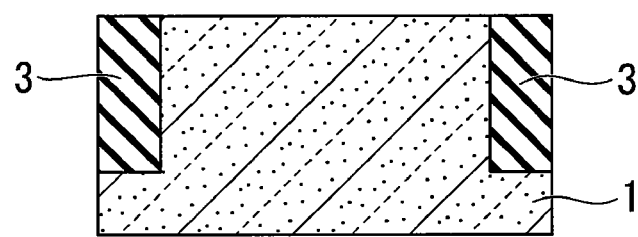
FIG. 14B is a fragmentary plan view illustrating the peripheral circuit region, taken along a B-B' line of FIG. 12, in the same step as in FIG. 14A and involved in the method of forming the semiconductor device of FIGS. 11, 12, 13A and 13B, in accordance with the second embodiment of the present invention.

First, as shown in FIGS. 14A and 14B, to define an active region K in a main surface of a semiconductor substrate 1 formed of P-type (or second conductivity type) silicon, isolation regions 3 with an insulating layer, such as a $SiO_2$ layer, buried therein are formed in the entire portion other than the active region K using an STI method.

As shown in FIG. 14A, groove patterns 2 for gate electrodes are formed in the memory cell region. The groove patterns 2 are formed by anisotropically dry-etching the silicon of the semiconductor substrate 1 using a photoresist layer (not shown) as a mask.

The silicon surface of the semiconductor substrate 1 is oxidized using a thermal oxidation method to form $SiO_2$, thereby forming a gate insulating layer 5a to a thickness of about 4 nm in a transistor forming region. The gate insulating layer 5a may be a stacked layer of $SiO_2$ and $Si_3N_4$ or a high-k layer.

A poly-Si layer containing N-type (or first conductivity type) impurities is formed on the gate insulating layer 5a by a CVD process using mono-silane ($SiH_4$) and phosphine ($PH_3$) as source gases. In this case, in the memory cell region, the thickness of the poly-Si layer is set to completely fill the insides of the groove patterns 2 for gate electrodes with the poly-Si layer. Alternatively, a poly-Si layer is formed not to contain impurities, such as P, and desired impurities, such as P, may be implanted into the poly-Si layer using an ion implantation process in a subsequent process. Next, a metal layer formed of a metal having a high melting point, such as W, WN, or WSi, is deposited on the poly-Si layer to a thickness of about 50 nm using a sputtering method. The poly-Si layer and the metal layer are formed in gate electrodes 5 and 105 through a process described below.

A plasma CVD method is performed using $SiH_4$ and ammonia ($NH_3$) as source gases so that an insulating layer 5c can be formed of $Si_3N_4$ to a thickness of about 70 nm on the metal layer constituting the gate electrodes 5 and 105. Next, a photoresist layer (not shown) is coated on the insulating layer 5c and patterned by a photolithography method using a mask for forming the gate electrodes 5 and 105, thereby forming a photoresist pattern for forming the gate electrodes 5 and 105. Thus, the insulating layer 5c is anisotropically etched using the photoresist pattern as a mask. After the photoresist pattern is removed, the metal layer and the poly-Si layer are etched using the insulating layer 5c as a hard mask, thereby forming the gate electrodes 5 and 105.

Figure 15A:
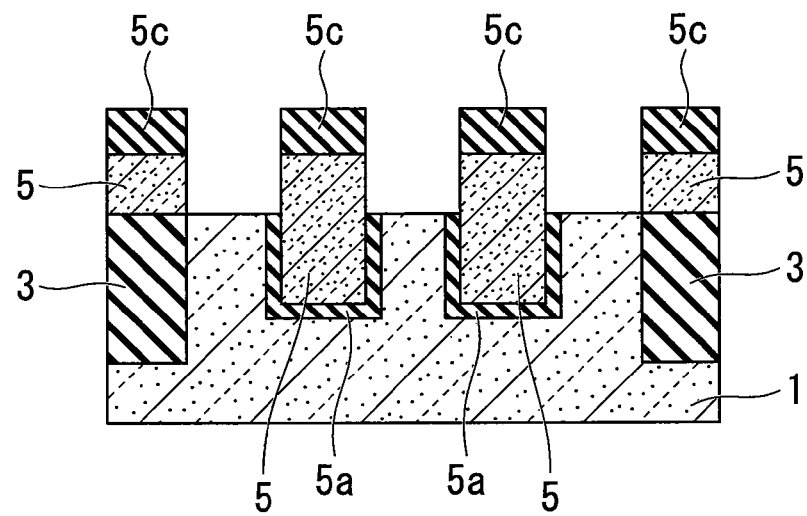
FIG. 15A is a fragmentary plan view illustrating the memory cell region, taken along an A-A' line of FIG. 11, in a step, subsequent to the step of FIG. 14A, involved in a method of forming the semiconductor device of FIGS. 11, 12, 13A and 13B, in accordance with the second embodiment of the present invention.
Figure 15B:
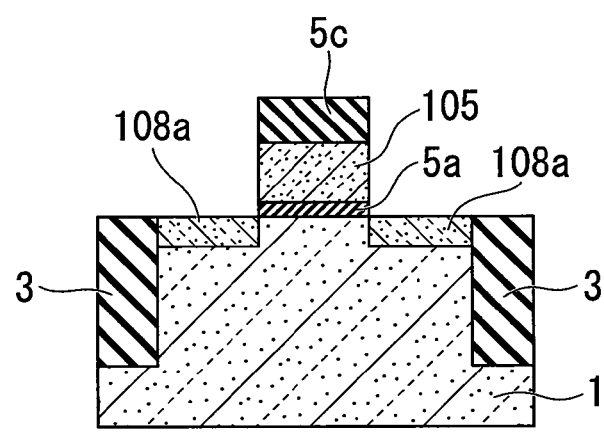
FIG. 15B is a fragmentary plan view illustrating the peripheral circuit region, taken along a B-B' line of FIG. 12, in the same step as in FIG. 15A, subsequent to the step of FIG. 14A, and involved in the method of forming the semiconductor device of FIGS. 11, 12, 13A and 13B, in accordance with the second embodiment of the present invention.

Thereafter, in a state where the entire memory cell region is covered with a pattern of a photoresist layer and the peripheral circuit region is exposed, B ions are implanted as P-type (or second conductivity type) impurities. Thus, a pocket impurity layer 108a is formed in the surface of the semiconductor substrate 1 in the peripheral circuit region. The ion implantation conditions may be set as in the first embodiment. A state of the pocket impurity layer 108a formed in the surface of the semiconductor substrate 1 is shown in FIGS. 15A and 15B.

Figure 16A:
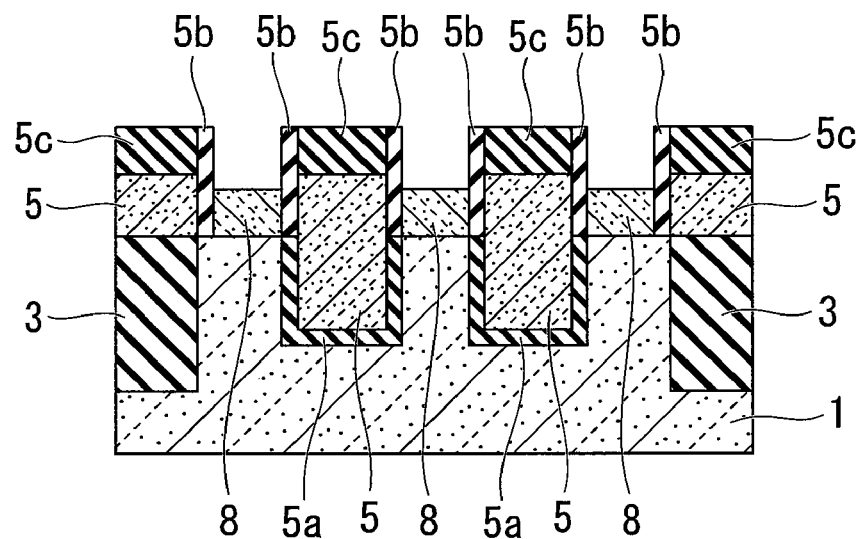
FIG. 16A is a fragmentary plan view illustrating the memory cell region, taken along an A-A' line of FIG. 11, in a step, subsequent to the step of FIG. 15A, involved in a method of forming the semiconductor device of FIGS. 11, 12, 13A and 13B, in accordance with the second embodiment of the present invention.
Figure 16B:
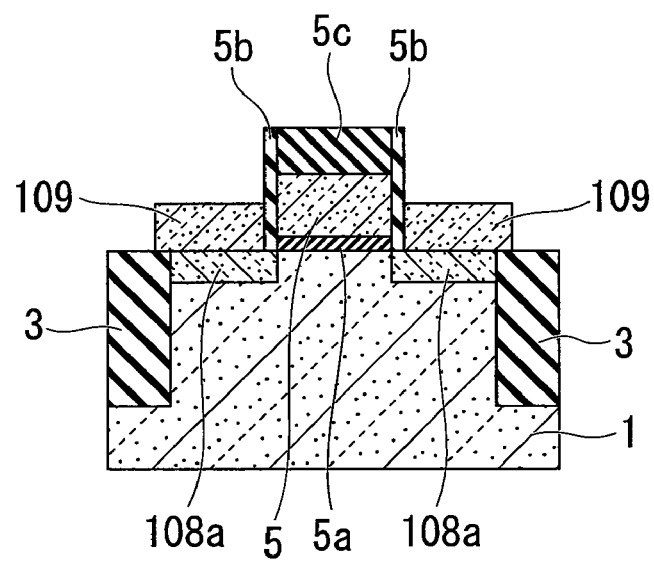
FIG. 16B is a fragmentary plan view illustrating the peripheral circuit region, taken along a B-B' line of FIG. 12, in the same step as in FIG. 16A, subsequent to the step of FIG. 15A, and involved in the method of forming the semiconductor device of FIGS. 11, 12, 13A and 13B, in accordance with the second embodiment of the present invention.

As shown in FIGS. 16A and 16B, a $Si_3N_4$ layer is deposited using an LPCVD process on the entire surface to a thickness of about 10 to 15 nm, and etched back to form first insulating-layer sidewalls 5b on lateral walls of the gate electrodes 5 and 105.

In a state where a pure silicon layer is exposed on the surface of the active region K formed in the semiconductor substrate 1, silicon layers 8 and 109 are simultaneously formed using an SEG process to a thickness of about 30 to 50 nm. For example, the SEG process may be a selective CVD process performed using hydrogen chloride (HCl) and $SiH_2Cl_2$ as reactive gases in a hydrogen ($H_2$) atmosphere set at a temperature of about 800° C. The silicon layers 8 and 109 are formed and deposited upward on regions of the active region K uncovered by the gate electrodes 5 and 105, and simultaneously, formed to have some extensions in a traverse direction in regions undefined by the first insulating-layer sidewalls 5b as shown in FIGS. 16A and 16B.

In a state where the memory cell region is covered with a photoresist layer (not shown) and the peripheral circuit region is exposed, P ions are implanted as N-type (or first conductivity type) impurities, thereby forming an LDD impurity layer 109a in the silicon layer 109 formed in the peripheral circuit region. The ion implantation condition may be set as in the first embodiment. During the ion implantation, ion implantation energy is set such that a projected range (Rp) for ion implantation lies midway along the thickness of the silicon layer 109.

A $Si_3N_4$ layer is deposited using an LPCVD process on the entire surface to a thickness of about 20 to 30 nm, and an etch-back process is performed to form second insulating-layer sidewalls 5d on lateral surfaces of the first insulating-layer sidewalls 5b.

Similarly, in a state where the memory cell region is covered with a photoresist layer (not shown) and the peripheral circuit region is exposed, As ions are implanted as N-type (first conductivity type) impurities. Thus, a high-concentration source/drain impurity layer 109b is formed in the silicon layer 109 formed in the peripheral circuit region. The ion implantation condition may be set as in the first embodiment. During the ion implantation process, ion implantation energy is set such that a projected range (Rp) for ion implantation ranges from a midway point in the thickness of the silicon layer 109 to the top surface of the silicon layer 109. Also, the impurity concentration of the high-concentration source/drain impurity layer 109b is set to be higher than that of the LDD impurity layer 109a. Subsequently, activation annealing of impurities is performed using an RTA process in a short period of time (about 5 to 10 seconds). The RTA conditions may be set as in the first embodiment.

Figure 17A:
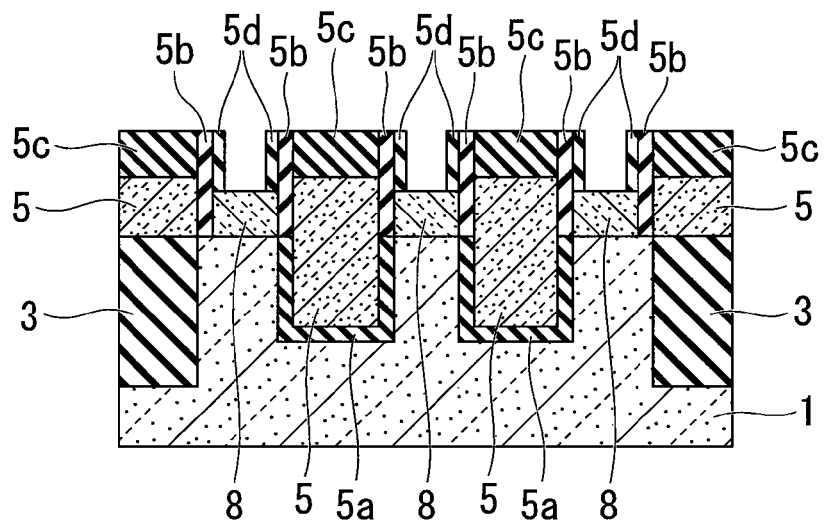
FIG. 17A is a fragmentary plan view illustrating the memory cell region, taken along an A-A' line of FIG. 11, in a step, subsequent to the step of FIG. 16A, involved in a method of forming the semiconductor device of FIGS. 11, 12, 13A and 13B, in accordance with the second embodiment of the present invention.
Figure 17B:
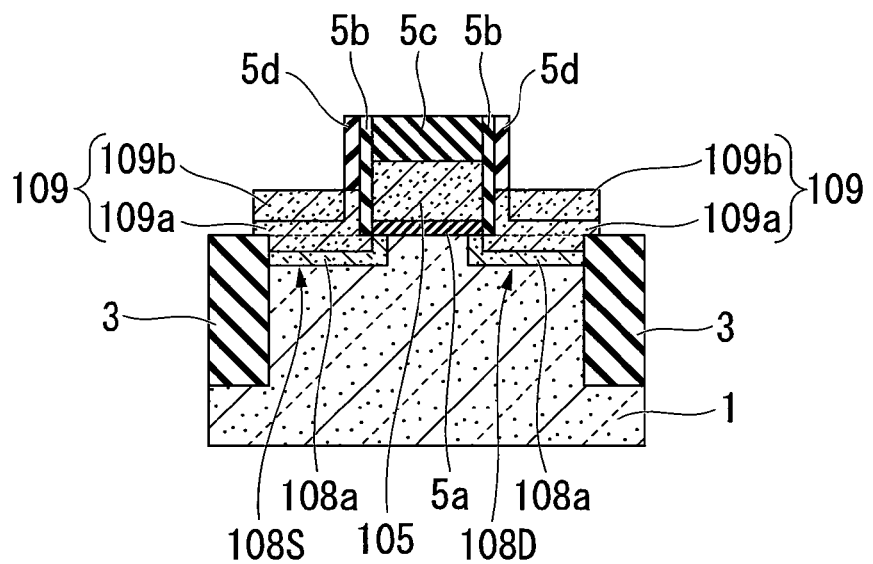
FIG. 17B is a fragmentary plan view illustrating the peripheral circuit region, taken along a B-B' line of FIG. 12, in the same step as in FIG. 17A, subsequent to the step of FIG. 16A, and involved in the method of forming the semiconductor device of FIGS. 11, 12, 13A and 13B, in accordance with the second embodiment of the present invention.

Thus, as shown in FIGS. 17A and 17B, a source 108S and a drain 108D of the MOS transistor Tr2 of the peripheral circuit region are formed.

Figure 18A:
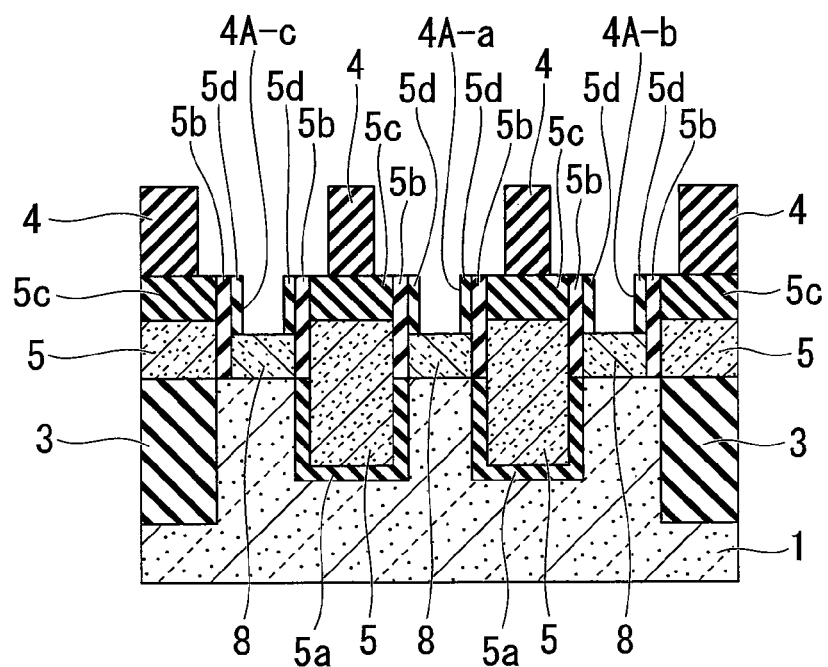
FIG. 18A is a fragmentary plan view illustrating the memory cell region, taken along an A-A' line of FIG. 11, in a step, subsequent to the step of FIG. 17A, involved in a method of forming the semiconductor device of FIGS. 11, 12, 13A and 13B, in accordance with the second embodiment of the present invention.
Figure 18B:
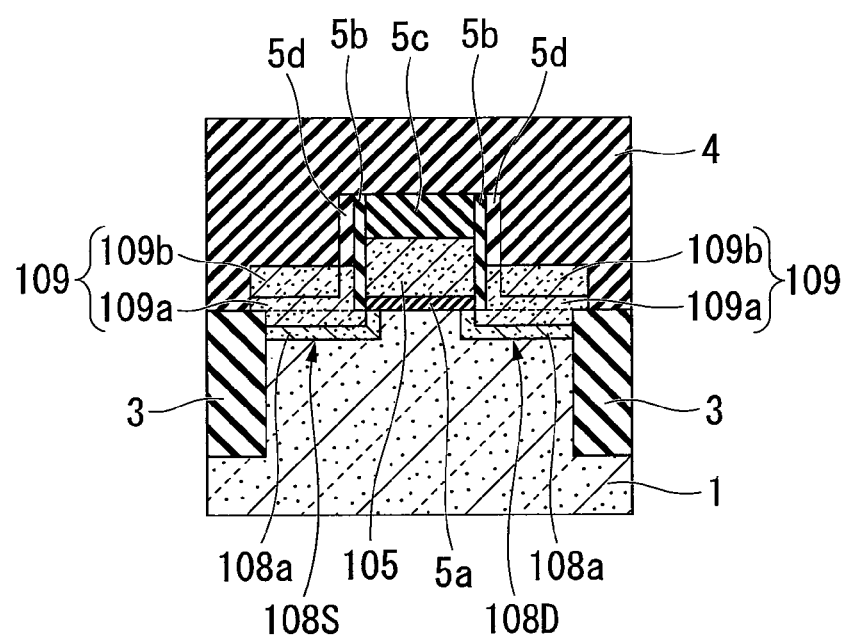
FIG. 18B is a fragmentary plan view illustrating the peripheral circuit region, taken along a B-B' line of FIG. 12, in the same step as in FIG. 18A, subsequent to the step of FIG. 17A, and involved in the method of forming the semiconductor device of FIGS. 11, 12, 13A and 13B, in accordance with the second embodiment of the present invention.

As shown in FIGS. 18A and 18B, a first interlayer insulating layer 4 is formed of $SiO_2$ using a CVD method to a thickness of, for example, about 600 nm to cover the gate electrodes 5 and 105 and the silicon layers 8 and 109. Thereafter, to planarize roughness originating from the gate electrodes 5 and 105, the first interlayer insulating layer 4 is polished using a CMP method to a thickness of, for example, about 300 nm.

Subsequently, openings (or contact holes) 4A-a, 4A-b, and 4A-c are formed using an ordinary method in positions corresponding to substrate contacts 205a, 205b, and 205c of the memory cell region (of FIG. 11) to partially expose the surface of the silicon layer 8 of the memory cell region.

Subsequently, N-type (or first conductivity type) impurity ions are implanted via the openings 4A-a, 4A-b, and 4A-c to form a cell impurity layer 8a in the silicon layer 8 and the surface of the semiconductor substrate 1. For example, when P ions are used, the ion implantation process may be performed at an energy of about 25 KeV to 40 KeV with a dose of $1\times10^{13}$ atoms/cm$^2$ to $6\times10^{13}$ atoms/cm$^2$. The impurity concentration of the cell impurity layer 8a is set to be lower than that of the LDD impurity layer 109a of the peripheral circuit region. Furthermore, when the cell impurity layer 8a is formed in the silicon layer 8 and both sides of the surface of the semiconductor substrate 1, an ion implantation process may be performed plural times by varying ion implantation energy. Activation annealing may be performed on the cell impurity layer 8a in a short period of time during activation annealing of impurities performed on the MOS transistor Tr2 of the peripheral circuit region.

Also, in consideration of the influence of annealing of a subsequent fabrication process, the cell impurity layer 8a may be formed in the surface portion of the semiconductor substrate 1 due to thermal diffusion from the silicon layer 8. Thus, a source 8S and a drain 8D of the MOS transistor Tr1 of the memory cell region are formed.

As a result, source and drain electrodes of the MOS transistor of the memory cell region are formed independently of the peripheral circuit region so that characteristics of the MOS transistor Tr1 can be optimized and an off-state leakage current can be reduced.

By reducing the impurity concentration of the source 8S and the drain 8D formed in the memory cell region, although the source 8S and the drain 8D may also be formed to as shallow a depth as possible from the surface of the semiconductor substrate, good refresh characteristics may be obtained.

Substrate contact plugs 4A are formed to fill the openings 4A-a, 4A-b, and 4A-c. The formation of the substrate contact plugs 4A is performed by forming a phosphorus-doped poly-Si layer on the entire surface and polishing the phosphorus-doped poly-Si layer using a CMP method until the surface of the first interlayer insulating layer 4 is exposed.

Substrate contact plugs 4A are formed to fill the openings 4A-a, 4A-b, and 4A-c. The formation of the substrate contact plugs 4A is performed by forming a phosphorus-doped poly-Si layer on the entire surface and polishing the phosphorus-doped poly-Si layer using a CMP method until the surface of the first interlayer insulating layer 4 is exposed.

Figure 19A:
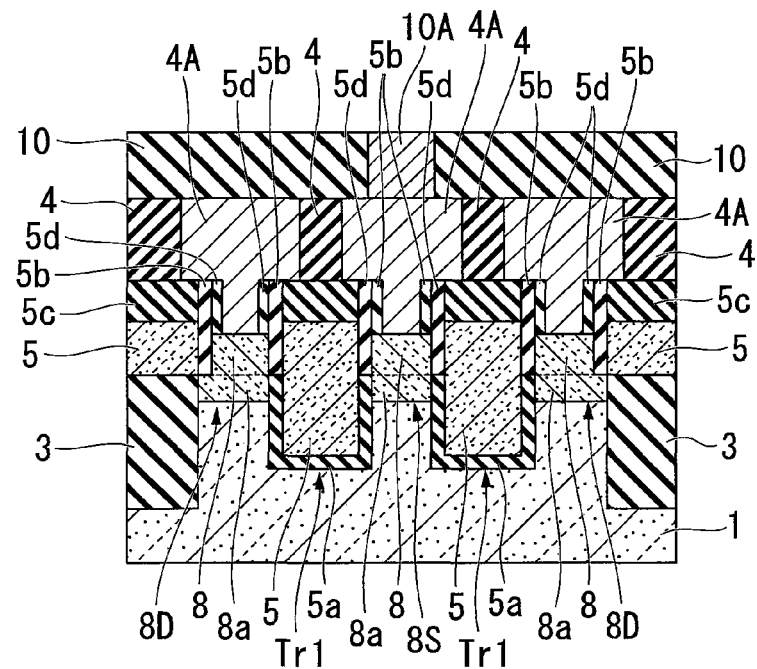
FIG. 19A is a fragmentary plan view illustrating the memory cell region, taken along an A-A' line of FIG. 11, in a step, subsequent to the step of FIG. 18A, involved in a method of forming the semiconductor device of FIGS. 11, 12, 13A and 13B, in accordance with the second embodiment of the present invention.
Figure 19B:
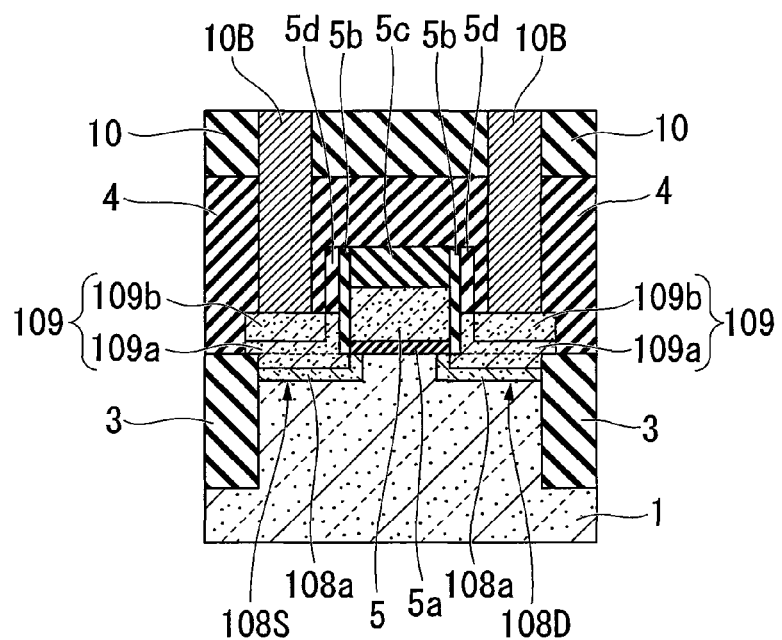
FIG. 19B is a fragmentary plan view illustrating the peripheral circuit region, taken along a B-B' line of FIG. 12, in the same step as in FIG. 19A, subsequent to the step of FIG. 18A, and involved in the method of forming the semiconductor device of FIGS. 11, 12, 13A and 13B, in accordance with the second embodiment of the present invention.

Openings are formed and filled with a layer obtained by stacking a W layer on a barrier layer formed of TiN/Ti, thereby forming bit line contact plugs 10A and contact plugs 10B using an ordinary method. The bit line contact plug 10A is connected to the substrate contact plug 4A (or a plug of the substrate contact 205a formed in the center of the active region) in the memory cell region, and the contact plug 10B is connected to the silicon layer 109 in the peripheral circuit region. The bit line contact plug 10A and the contact plugs 10B may be formed simultaneously or through separate processes. The resultant structure in which the bit line contact plug 10A and the contact plugs 10B are formed is illustrated in FIGS. 19A and 19B.

Figure 20A:
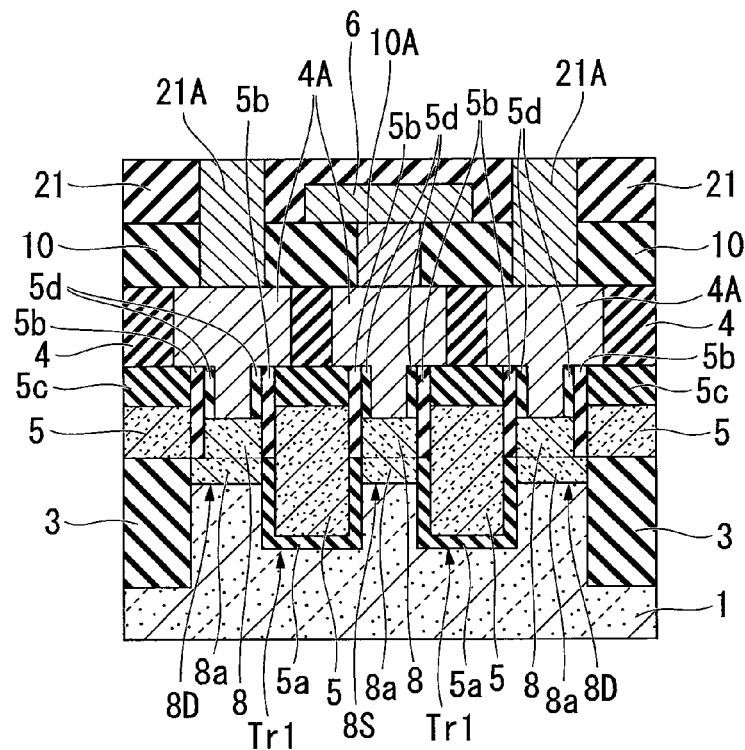
FIG. 20A is a fragmentary plan view illustrating the memory cell region, taken along an A-A' line of FIG. 11, in a step, subsequent to the step of FIG. 19A, involved in a method of forming the semiconductor device of FIGS. 11, 12, 13A and 13B, in accordance with the second embodiment of the present invention.
Figure 20B:
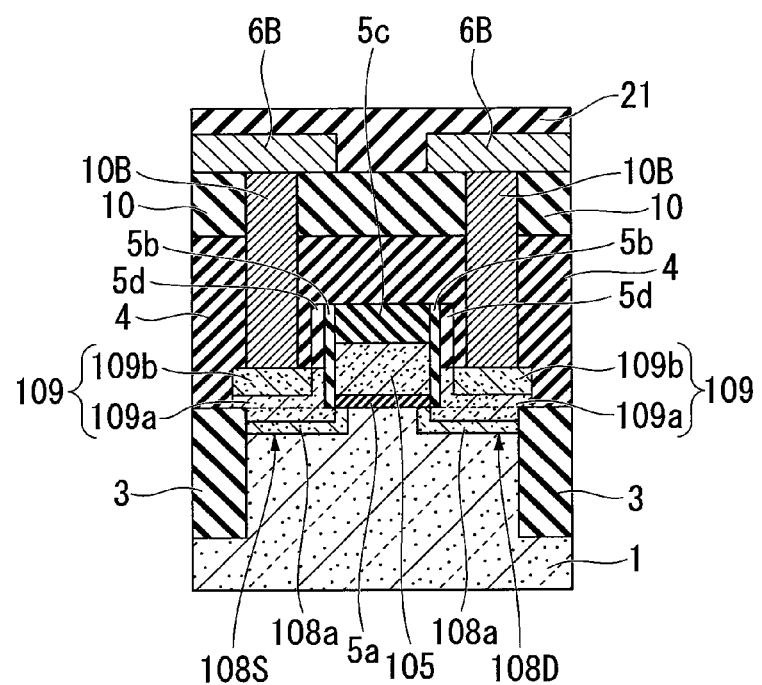
FIG. 20B is a fragmentary plan view illustrating the peripheral circuit region, taken along a B-B' line of FIG. 12, in the same step as in FIG. 20A, subsequent to the step of FIG. 19A, and involved in the method of forming the semiconductor device of FIGS. 11, 12, 13A and 13B, in accordance with the second embodiment of the present invention.

As shown in FIGS. 20A and 20B, a stacked layer of a WN layer and a W layer is deposited and patterned to form a bit line 6 connected to the bit line contact plug 10A in the memory cell region and simultaneously, faun interconnection layers 6B connected to the contact plugs 10B in the peripheral circuit region. Next, a third interlayer insulating layer 21 is formed of $SiO_2$ to cover the bit line 6 of the memory cell region and the interconnection layers 6B of the peripheral circuit region. Subsequently, capacitor contact plugs 21A are formed to be connected to the substrate contact plugs 4A (or plugs of the substrate contacts 205b and 205c formed in end portions of the active region) in the memory cell region. The capacitor contact plug 21 may be formed by filling an opening with a layer obtained by stacking a W layer on a barrier layer formed of TiN/Ti.

Thereafter, as shown in FIGS. 13A and 13B, a fourth interlayer insulating layer 22 is formed of $SiO_2$. Next, capacitor elements 24 are formed in the memory cell region. The capacitor element 24 may be formed by interposing a capacitor insulating layer 24b formed of a high-k material, such as $HfO_2$, $ZrO_2$, or $Al_2O_3$ between a lower electrode 24a and an upper electrode 24c that are formed of TiN.

A fifth interlayer insulating layer 30 is formed of $SiO_2$. Peripheral contact plugs 22B are formed to be connected to the interconnection layers 6B in the peripheral circuit region. A leading contact plug (not shown) for applying an electric potential to the upper electrode 24c of the capacitor element 24 is formed in the memory cell region. Thereafter, upper metal interconnection layers 31 are formed of Al or Cu. The metal interconnection layers 31 are connected to the peripheral contact plugs 22B in the peripheral circuit region. Subsequently, as shown in FIGS. 13A and 13B, a surface protection layer 32 is formed of SiON, thereby completing fabrication of a DRAM device as a semiconductor device.

In the present embodiment, although a case where the MOS transistor Tr2 of the peripheral circuit is an N-channel transistor has been described, a P-channel MOS transistor to which the present invention is applied may be formed in the same manner and constitute a CMOS circuit. In this case, an N-type well is formed beforehand in a region of the semiconductor substrate 1 where the P-channel transistor will be formed. Thus, N-type impurities, such as P, may be implanted to form the pocket impurity layer 108a, P-type impurities, such as B, are implanted to form the LDD impurity layer 109a, and P-type impurities, such as $BF_2$, may be implanted to form the high-concentration source/drain impurity layer 109b.

Since the ion implantation conditions described in the present embodiment are only an example, changes in ion implantation energy, dose, and kind of ions may be made without departing from the spirit and scope of the present invention. Also, materials and thicknesses of the insulating layer and the gate electrode may be changed.

In the DRAM device formed according to the present invention, the MOS transistor disposed in the peripheral circuit region is the MOS transistor of the first embodiment of the present invention. Accordingly, it is possible to suppress the short channel effect of the MOS transistor of the peripheral circuit region, thereby easily keeping up with high-integration and high-performance of devices. Therefore, highly efficient DRAM devices having fast response and long-term reliability can be easily fabricated.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
a semiconductor substrate;
a gate insulating film formed on a surface of the semiconductor substrate;
a gate electrode formed on the gate insulating film;
a first sidewall insulating film formed on a side surface of the gate electrode; and
source and drain regions, each of the source and drain regions comprising:
a pocket diffusion layer of a first conductivity type in the semiconductor device;
a first diffusion layer of a second conductivity type extending over the pocket diffusion layer, and the first diffusion layer facing toward the gate electrode through the first sidewall insulating film; and
a second diffusion layer of the second conductivity type being higher in impurity concentration than the first diffusion layer, the second diffusion layer extending over the first diffusion layer, the second diffusion layer being separated by the first diffusion layer from the pocket diffusion layer, the second diffusion layer having a side surface which faces toward the first sidewall insulating film through the first diffusion layer.

2. The semiconductor device according to claim 1, wherein the second diffusion layer has a bottom surface which is higher than the surface of the semiconductor substrate.

3. The semiconductor device according to claim 1, wherein the second diffusion layer has a bottom surface which is higher than the gate insulating film.

4. The semiconductor device according to claim 1, wherein the first diffusion layer contacts the pocket diffusion layer.

5. The semiconductor device according to claim 1, further comprising:
a second sidewall insulating film extending along the first sidewall insulating film, the second sidewall insulating film being positioned on a top portion of the first diffusion layer.

6. The semiconductor device according to claim 1, further comprising:
an isolation layer in the semiconductor substrate, the isolation layer defining an active region in which the source and drain regions are positioned, the isolation layer having a bottom surface which is deeper than a bottom surface of the pocket diffusion layer.

7. A semiconductor device comprising:
a first circuit region comprising a first transistor; and
a second circuit region comprising a second transistor, the second circuit region being isolated from the first circuit region,
the first transistor comprising:
a first active region;
a first gate insulating film formed on a surface of the first active region;
a first gate electrode formed on the first gate insulating film;
a first sidewall insulating film formed on a side surface of the first gate electrode; and
first source and drain regions, each of the first source and drain regions comprising:
a pocket diffusion layer of a first conductivity type in the first active region;
a first diffusion layer of a second conductivity type extending over the pocket diffusion layer, and the first diffusion layer facing toward the gate electrode through the first sidewall insulating film; and
a second diffusion layer of the second conductivity type being higher in impurity concentration than the first diffusion layer, the second diffusion layer extending over the first diffusion layer, the second diffusion layer being separated by the first diffusion layer from the pocket diffusion layer, the second diffusion layer having a side surface which faces toward the first sidewall insulating film through the first diffusion layer, and
the second transistor comprising:
a second active region;
a second gate electrode formed in the second active region;
a semiconductor layer on a surface of the second active region; and
second source and drain regions that formed in the semiconductor layer and in the second active region, and the second source and drain regions being lower in impurity concentration than the first diffusion layer.

8. The semiconductor device according to claim 7, wherein the second diffusion layer has a bottom surface which is higher than the surface of the semiconductor substrate.

9. The semiconductor device according to claim 7, wherein the second diffusion layer has a bottom surface which is higher than the gate insulating film.

10. The semiconductor device according to claim 7, wherein the first diffusion layer contacts the pocket diffusion layer.

11. The semiconductor device according to claim 7, further comprising:

a second sidewall insulating film extending along the first sidewall insulating film, the second sidewall insulating film being positioned on a top portion of the first diffusion layer.

12. The semiconductor device according to claim 7, wherein the first circuit region comprises a peripheral circuit region,
the second circuit region comprises a memory cell region,
the first transistor is a planer transistor,
the second transistor is a trench transistor, and
the second gate electrode is partially buried in the semiconductor substrate.

13. The semiconductor device according to claim 12, further comprising:
a bit line connected to a first one of the second source and drain regions in the memory cell region; and
a capacitor element connected to a second one of the second source and drain regions in the memory cell region.

14. A semiconductor device comprising:
a semiconductor substrate;
a gate insulating film on a surface of the semiconductor substrate;
a gate electrode on the gate insulating film;
a first sidewall insulating film on a side surface of the gate electrode;
a pocket diffusion layer of a first conductivity type in the semiconductor device;
a first diffusion layer of a second conductivity type facing toward the gate electrode through the first sidewall insulating film; and
a second diffusion layer of the second conductivity type being higher in impurity concentration than the first diffusion layer, the second diffusion layer having a side surface which faces toward the first sidewall insulating film through the first diffusion layer.

15. The semiconductor device according to claim 14, wherein the first diffusion layer comprises first and second portions, the first portion extends over the pocket diffusion layer, and the second portion extends along the first sidewall insulating film,
the second diffusion layer extends over the first portion of the first diffusion layer, the second diffusion layer is separated by the first portion of the first diffusion layer from the pocket diffusion layer, the second diffusion layer is separated by the second portion of the first diffusion layer and the first sidewall insulating film from the gate electrode.

16. The semiconductor device according to claim 14, wherein the second diffusion layer has a bottom surface which is higher than the surface of the semiconductor substrate.

17. The semiconductor device according to claim 14, wherein the first diffusion layer contacts the pocket diffusion layer.

18. The semiconductor device according to claim 14, further comprising:
a second sidewall insulating film extending along the first sidewall insulating film, the second sidewall insulating film being positioned on a top portion of the side surface of the second diffusion layer.

19. The semiconductor device according to claim 14, further comprising:
a bit line connected to the second diffusion layer.

20. The semiconductor device according to claim 14, further comprising:
a capacitor element connected to the second diffusion layer.

* * * * *